(12) United States Patent
Landi et al.

(10) Patent No.: US 7,879,306 B2
(45) Date of Patent: Feb. 1, 2011

(54) DISPERSION AND SEPARATION OF NANOSTRUCTURED CARBON IN ORGANIC SOLVENTS

(75) Inventors: Brian J. Landi, Rochester, NY (US); Ryne P. Raffaelle, Honeoye Falls, NY (US); Herbert J. Ruf, Spencerport, NY (US); Christopher M. Evans, Scottsville, NY (US)

(73) Assignee: Rochester Institute of Technology, Rochester, NY (US)

( * ) Notice: Subject to any disclaimer, the term of this patent is extended or adjusted under 35 U.S.C. 154(b) by 1322 days.

(21) Appl. No.: 11/263,413

(22) Filed: Oct. 31, 2005

(65) Prior Publication Data

US 2008/0008643 A1 Jan. 10, 2008

Related U.S. Application Data

(60) Provisional application No. 60/623,322, filed on Oct. 29, 2004.

(51) Int. Cl.
*C01B 31/00* (2006.01)
(52) U.S. Cl. .................. 423/445 R; 423/414; 423/447.2
(58) Field of Classification Search ........................ None
See application file for complete search history.

(56) References Cited

PUBLICATIONS

Sreekumar et al., "Polyacrylonitrile Single-Walled Carbon Nanotube Composite Fibers", Advanced Materials, Jan. 5, 2004, v. 16, No. 1, pp. 58-61.*

"Introducing Amides", Jun. 19, 2004, http://www.chemguide.co.uk/organicprops/amides/background.html.*

Anderson, "Inquiry Project: Intermolecular Attraction andBoiling Points of Straight Chain Amides", Feb. 2002, file:// C:\DOCUME~1\ygakh\LOCALS~2\Temp\IFZF6226.htm.*

Furtado et al. in "Debundling and Dissolution of Single-Walled Carbon Nanotubes in Amide Solvents", J. Am. Chem. Soc., 2004, v. 126, pp. 6095-6105, published on Web Apr. 24, 2004.*

Wise et al. "Stable dispersion of single wall carbon nanotubes in polyimide: the role of noncovalent interactions", Chemical Physics Letters, 2004, v. 391, pp. 207-211.*

Kim et al. "Individualization of Single-Walled Carbon Nanotubes: Is the Solvent Important?", Small, 2005, v. 1, No. 11, pp. 1117-1124.*

Hasan et al. "Dispersibility and stability improvement of unfunctionalized nanotubes in amide solvents by polymer wrapping", Physica E, 2008, v. 40, pp. 2414-2418.*

Ganter et al. "Variation of single wall carbon nanotube dispersion properties with alkyl amide and halogenated aromatic solvents", Materials Chemistry and Physics, 2009, v. 116, pp. 235-241.*

Landi et al. "Effects of Alkyl Amide Solvents on the Dispersion of Single-Wall Carbon Nanotubes", J. Phys. Chem. B 2004, v. 108, pp. 17089-17095.*

Arepalli et al., "Protocol for the Characterization of Single-Wall Carbon Nanotube Material Quality," *Carbon* 42:1783-1791 (2004).

(Continued)

*Primary Examiner*—Yelena G Gakh
(74) *Attorney, Agent, or Firm*—Nixon Peabody LLP

(57) ABSTRACT

The present invention relates to dispersions of nanostructured carbon in organic solvents containing alkyl amide compounds and/or diamide compounds. The invention also relates to methods of dispersing nanostructured carbon in organic solvents and methods of mobilizing nanostructured carbon. Also disclosed are methods of determining the purity of nanostructured carbon.

36 Claims, 20 Drawing Sheets

OTHER PUBLICATIONS

Ausman et al., "Organic Solvent Dispersions of Single-Walled Carbon Nanotubes: Toward Solutions of Pristine Nanotubes," *J. Phys. Chem. B* 104(38):8911-8915 (2000).

Avouris et al., "Carbon Nanotube Transistors and Logic Circuits," *Physica B* 232:6-14 (2002).

Bahr et al., "Dissolution of Small Diameter Single-Wall Carbon Nanotubes in Organic Solvents?" *Chem. Commun.* 2:193-194 (2001).

Chattopadhyay et al., "A Route for Bulk Separation of Semiconducting from Metallic Single-Wall Carbon Nanotubes," *JACS* 125:3370-3375 (2003).

Chen et al., "Dissolution of Full-Length Single-Walled Carbon Nanotubes," *J. Phys. Chem. B* 105:2525-2528 (2001).

Chen et al., "Solution Properties of Single-Walled Carbon Nanotubes," *Science* 282:95-98 (1998).

Chiang et al., "Purification and Characterization of Single-Wall Carbon Nanotubes," *J. Phys. Chem. B* 105:1157-1161 (2001).

Chiang et al., "Purification and Characterization of Single-Wall Carbon Nanotubes (SWNTs) Obtained from the Gas-Phase Decomposition of CO (HiPco Process)," *J. Phys. Chem. B* 105:8297-8301 (2001).

Dai, "Carbon Nanotubes: Opportunities and Challenges," *Surface Sci.* 500:218-241 (2002).

Dillon et al., "A Simple and Complete Purification of Single-Walled Carbon Nanotube Materials," *Adv. Mater.* 11(16):1354-1358 (1999).

Dillon et al., "Evaluating the Purity of Single-Wall Nanotube Materials," *Mat. Res. Soc. Symp. Proc.* 633:A5.2.1-A5.2.6 (2001).

Harutyunyan et al., "Purification of Single-Wall Carbon Nanotubes by Selective Microwave Heating of Catalyst Particles," *J. Phys. Chem. B* 106:8671-8675 (2002).

Kahn et al., "Solubilization of Oxidized Single-Walled Carbon Nanotubes in Organic and Aqueous Solvents through Organic Derivatization," *Nano Lett.* 2(11):1215-1218 (2002).

Krupke et al., "Near-Infrared Absorbance of Single-Walled Carbon Nanotubes Dispersed in Dimethylformamide," *J. Phys. Chem. B* 107(24):5667-5669 (2003).

Landi et al., "Effects of Alkyl Amide Solvents on the Dispersion of Single-Wall Carbon Nanotubes," *J. Phys. Chem. B* 108:17089-17095 (2004).

Landi et al., "Purity Assessment of Single-Wall Carbon Nanotubes, Using Optical Absorption Spectroscopy," *J. Phys. Chem. B* 19:9952-9965 (2005).

Landi et al., "Single Wall Carbon Nanotube-Nafion Composite Actuators," *Nano Lett.* 2(11):1329-1332 (2002).

Laurence et al., "The Empirical Treatment of Solvent-Solute Interactions: 15 Years of $\pi$," *J. Phys. Chem.* 98:5807-5816 (1994).

Lumetta et al., "Deliberate Design of Ligand Architecture Yields Dramatic Enhancement of Metal Ion Affinity," *JACS* 124:5644-5645 (2002).

Martínez et al., "Sensitivity of Single Wall Carbon Nanotubes to Oxidative Processing: Structural Modification, Intercalation and Functionalisation," *Carbon* 41:2247-2256 (2003).

Matarredona et al., "Dispersion of Single-Walled Carbon Nanotubes in Aqueous Solutions of the Anionic Surfactant NaDDBS," *J. Phys. Chem. B* 107:13357-13367 (2003).

Moon et al., "High-Yield Purification Process of Singlewalled Carbon Nanotubes," *J. Phys. Chem. B* 105:5677-5681 (2001).

Niyogi et al., "Ultrasonic Dispersions of Single-Walled Carbon Nanotubes," *J. Phys. Chem. B* 107:8799-8804 (2003).

O'Connell et al., "Band Gap Fluorescence from Individual Single-Walled Carbon Nanotubes," *Science* 297:593-596 (2002).

O'Connell et al., "Reversible Water-Solubilization of Single-Walled Carbon Nanotubes by Polymer Wrapping," *Chem. Phys. Lett.* 342:265-271 (2001).

Peng et al., "Sidewall Carboxylic Acid Functionalization of Single-Walled Carbon Nanotubes," *JACS* 125:15174-15182 (2003).

Strong et al., "Purification Process for Single-Wall Carbon Nanotubes," *Carbon* 41:1477-1488 (2003).

Strong, "Theoretical Basis of the Bouguer-Beer Law of Radiation Absorption," *Anal. Chem.* 24:338-342 (1952).

Zhou et al., "Absorptivity of Functionalized Single-Walled Carbon Nanotubes in Solution," *J. Phys. Chem. B* 107:13588-13592 (2003).

\* cited by examiner

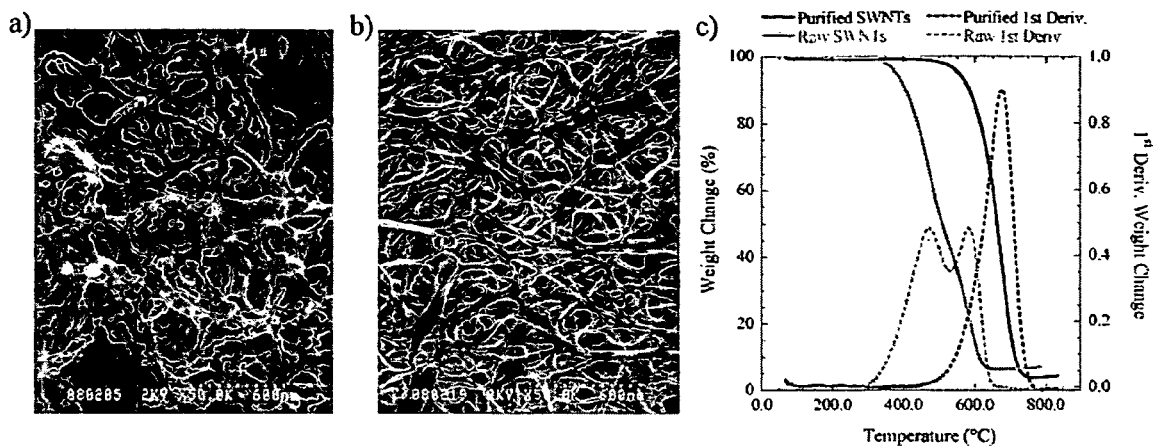
Figures 1a-c
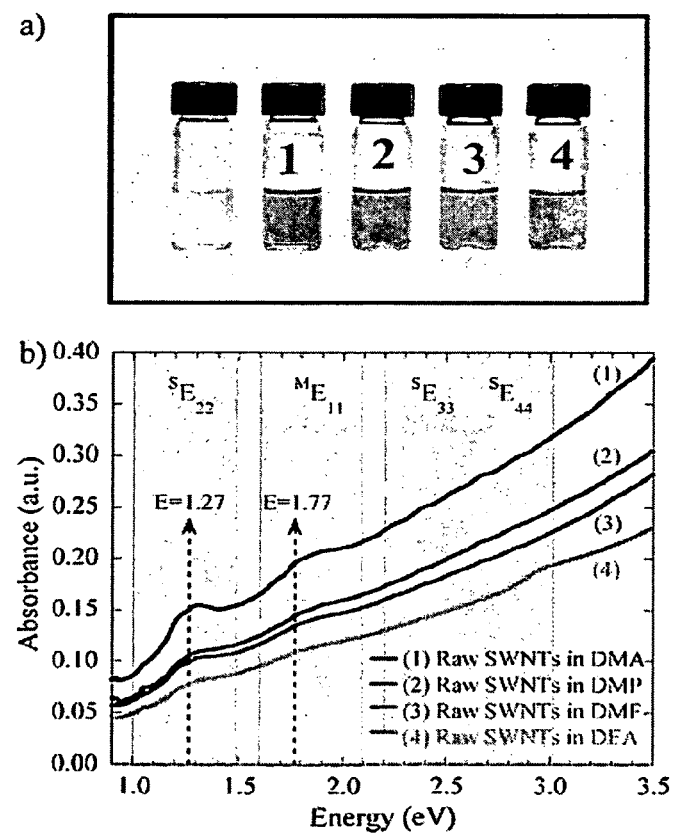
Figures 2a-b

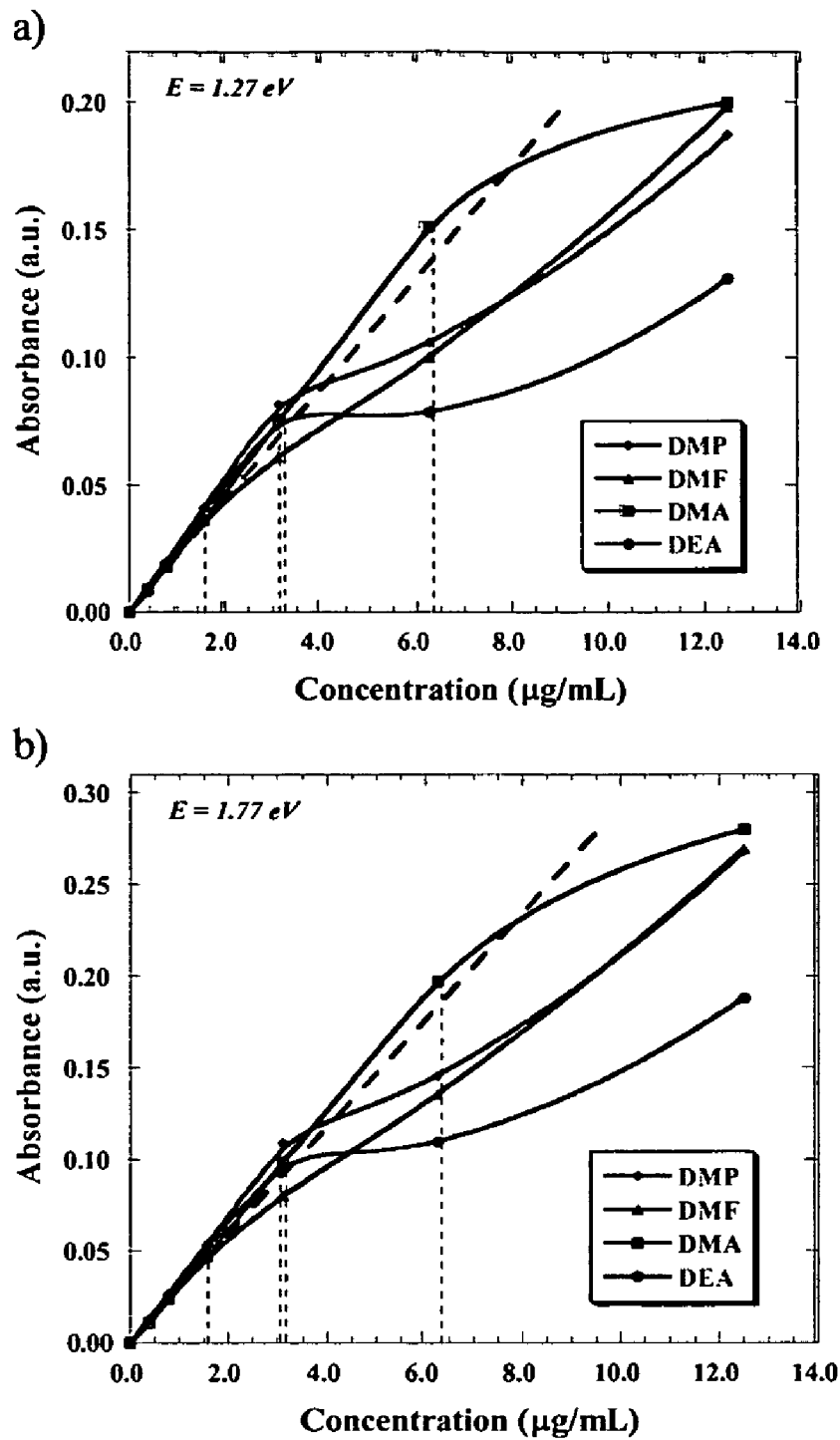
Figures 3a-b

Figures 5a-b

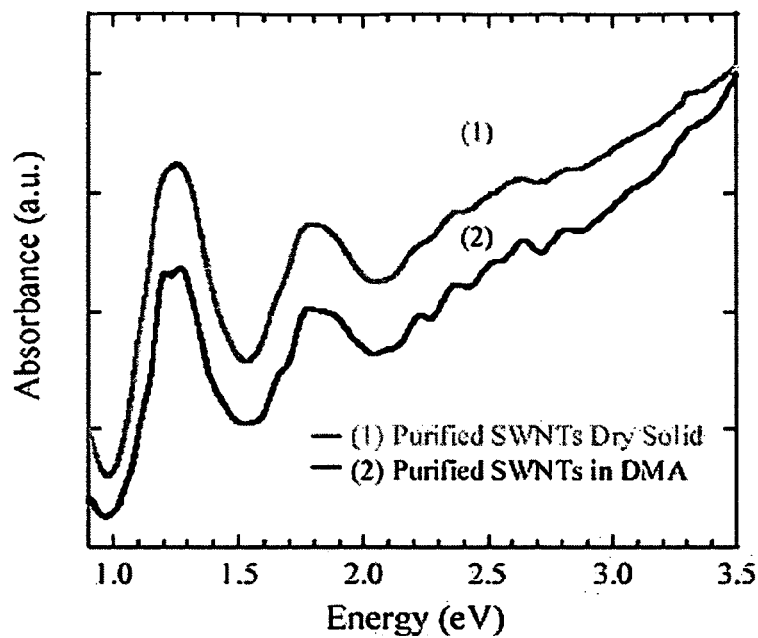
Figure 6
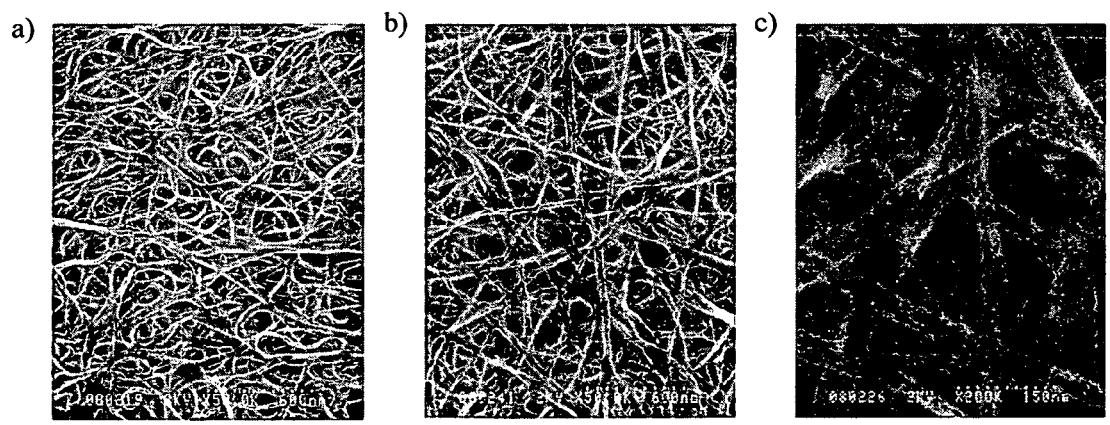
Figures 7a-c

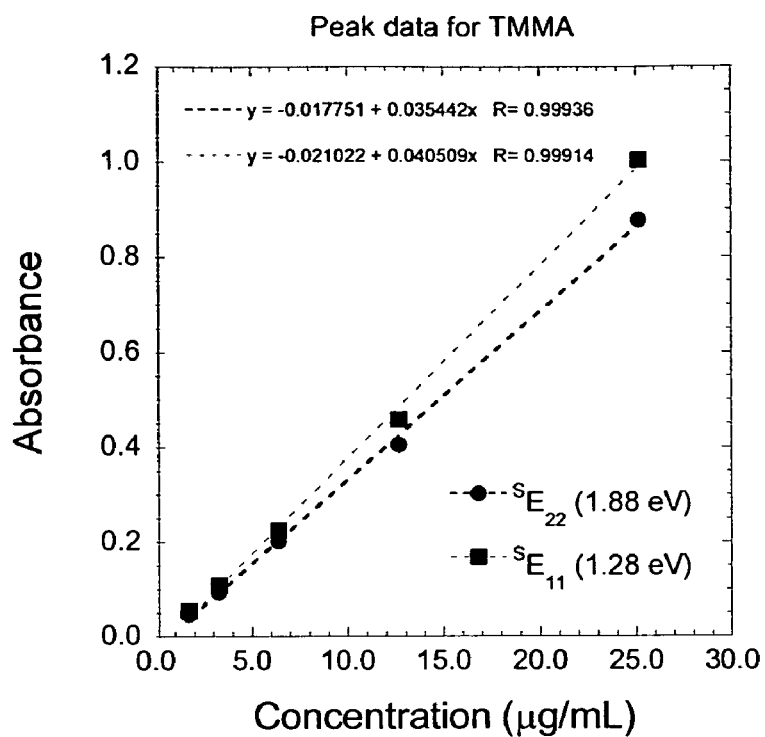
Figure 9
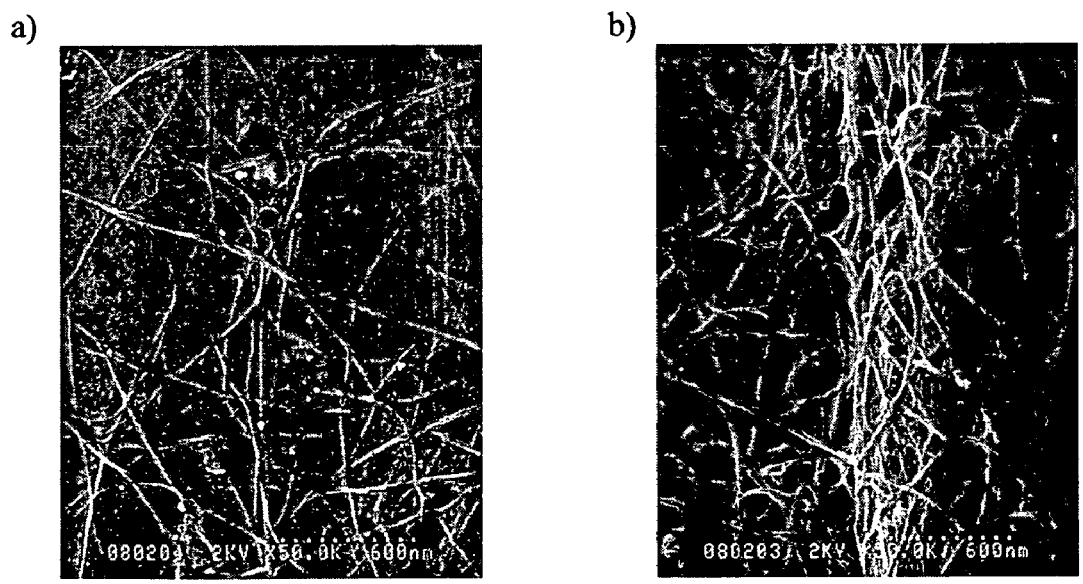
Figures 10a-b

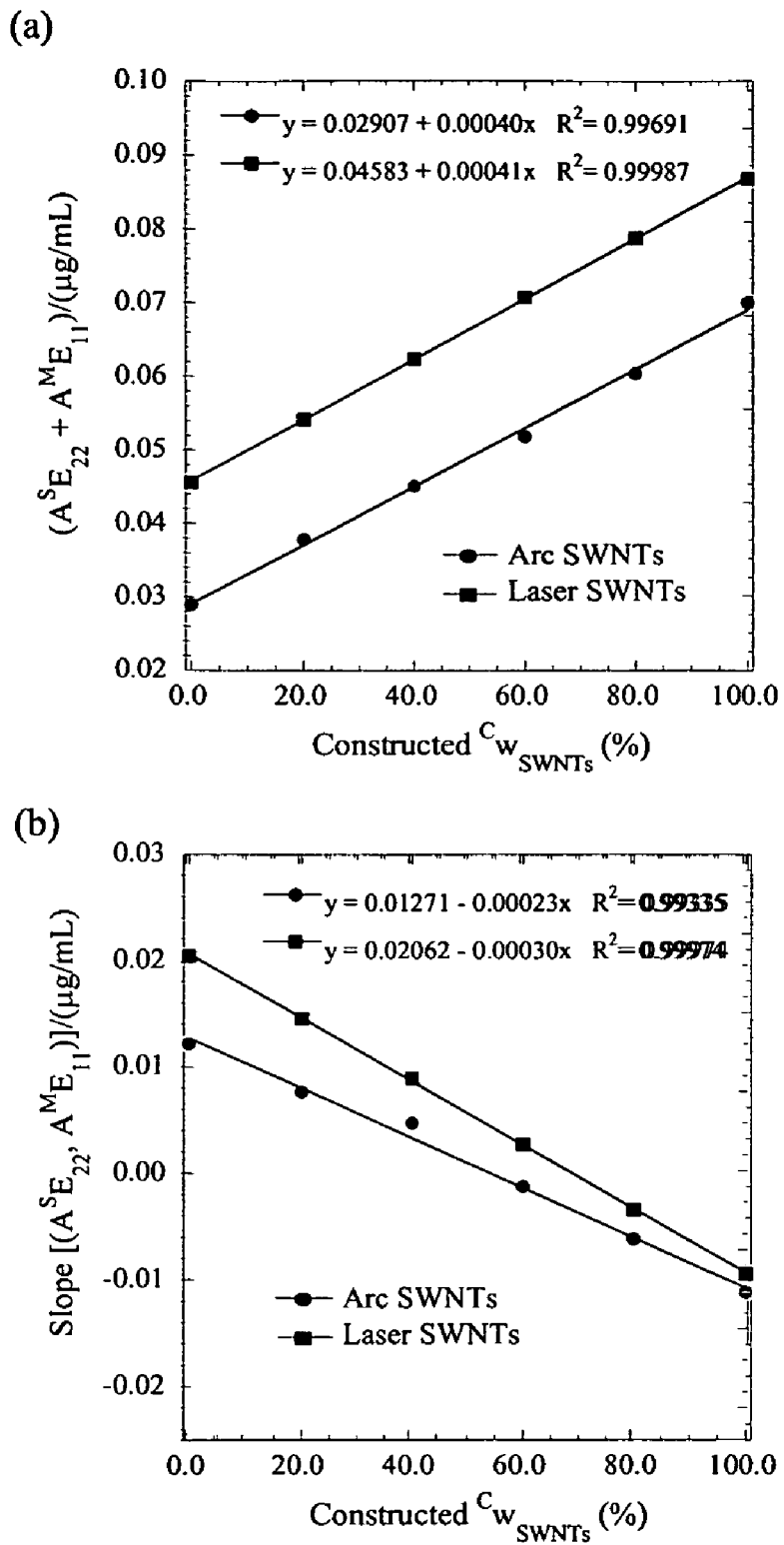
Figures 24a-b

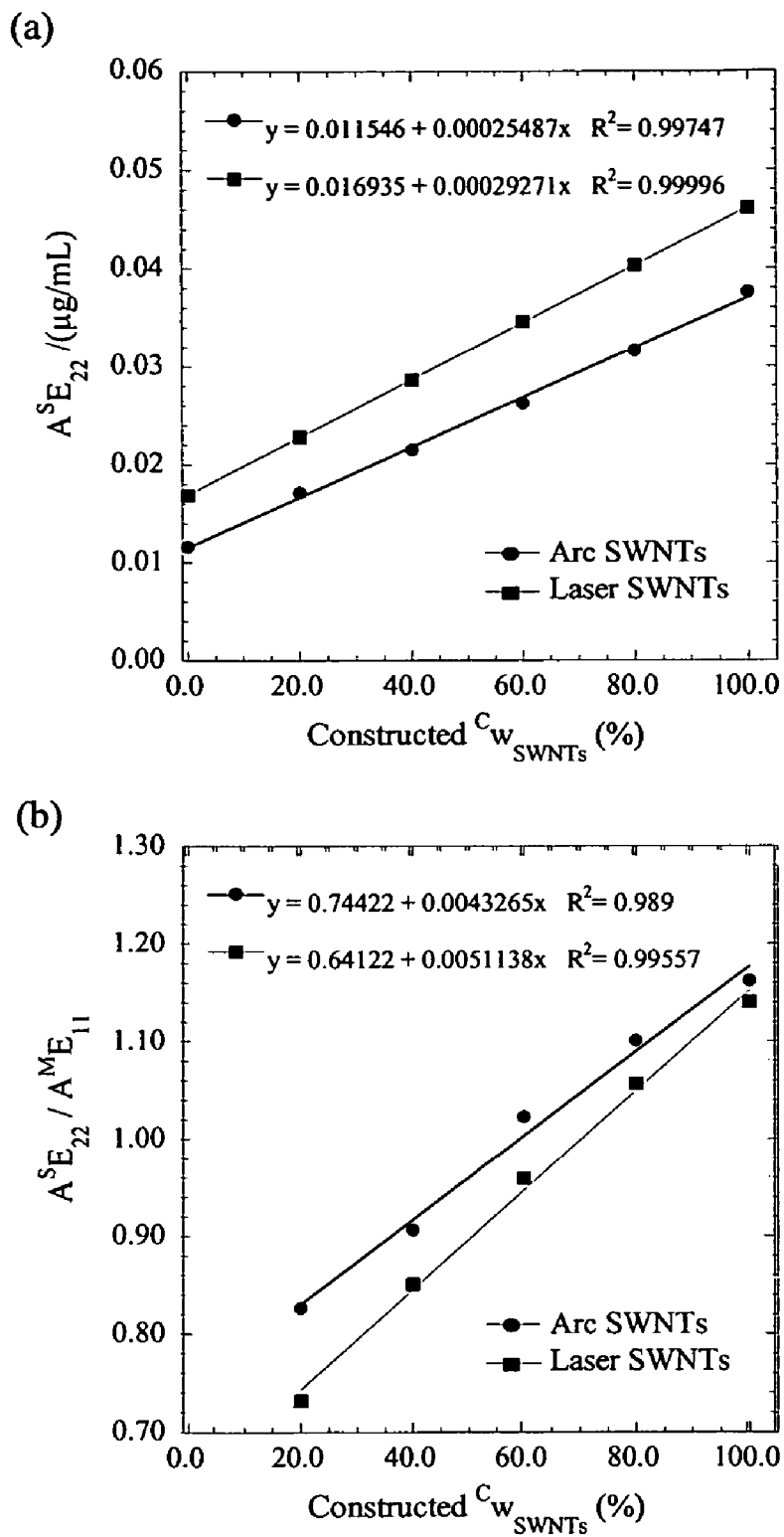
Figures 25a-b

DISPERSION AND SEPARATION OF NANOSTRUCTURED CARBON IN ORGANIC SOLVENTS

This application claims the priority benefit of U.S. Provisional Patent Application Ser. No. 60/623,322, filed Oct. 29, 2004, which is hereby incorporated by reference in its entirety.

The subject matter of this application was made with support from the United States Government under NSF Grant No. ECS0233776, NASA Grant No. NAG3-2828, and NASA Grant No. NCC3-053. The United States Government has certain rights.

FIELD OF THE INVENTION

The present invention relates to dispersions of nanostructured carbon in organic solvents, methods of dispersing and mobilizing nanostructured carbon, and methods of determining purity of nanostructured carbon.

BACKGROUND OF THE INVENTION

The unique electrical, optical, and mechanical properties inherent to carbon nanostructures, such as single wall carbon nanotubes ("SWNTs"), have garnered tremendous interest in basic science and applied research (Avouris et al., J. Phys. B 323:6 (2002); Dai, Surf. Sci. 500:218 (2002); and Landi et al., Nano Lett. 2:1329 (2002)). The opportunity to exploit these properties depends on the successful characterization and manipulation of desired materials. In some cases, the necessity to utilize solution phase techniques is hindered by the inability to form stable SWNT dispersions. Many groups have resorted to functionalization strategies (Peng et al., Am. Chem. Soc. 125:15174 (2003); Kahn et al., Nano Lett. 2:1215 (2002)), including the use of polymers (Landi et al., Nano Lett. 2:1329 (2002); O'Connell et al., Chem. Phys. Lett. 342:265-271 (2001)), surfactants (O'Connell et al., Science 297:593 (2002); Matarredona et al., J. Phys. Chem. 107:13357 (2003)), and amines to assist in dispersing SWNTs (Chen et al., Science 282:95 (1998); Chen et al., J. Phys. Chem. B 105:2525 (2001); Chattopadhyay et al., J. Am. Chem. Soc. 125:3370 (2003)). However, these techniques may disrupt SWNT structure, alter electronic properties, or be problematic for subsequent removal (Ausman et al., J. Phys. Chem. B 104:8911 (2000)). Therefore, the dispersion of as-produced, high aspect ratio, raw, and purified SWNTs in a suitable solvent is necessary to enable more accurate solution phase analyses.

The most promising attempts at forming stable SWNT dispersions have been with organic amide solvents such as N,N-dimethylformamide ("DMF") and N-methylpyrrolidone ("NMP") (Ausman et al., J. Phys. Chem. B 104:8911 (2000); Krupke et al., J. Phys. Chem. B 107:5667 (2003)), and with 1,2-dichlorobenzene ("DCB") for both HiPco and laser-generated SWNTs (Bahr et al., Chem. Commun. 2:193 (2001)). Calculation of the extinction coefficient at 2.48 eV (500 nm) for as-produced HiPco SWNTs in DCB was reported to be 28.6 mL·mg$^{-1}$·cm$^{-1}$ (Bahr et al., Chem. Commun. 2:193 (2001)). This is higher than the recently reported value of 9.7 mL·mg$^{-1}$·cm$^{-1}$ for arc-discharge functionalized SWNTs in CS$_2$ at the same energy (Zhou et al., J. Phys. Chem. B 107:13588 (2003)). These results imply that variations exist for the extinction properties of SWNT materials, potentially occurring from differences in diameter distributions, purity, and/or solvent effects. Dispersion of SWNTs in organic amide solvents has been attributed to the availability of a free electron pair and high solvatochromic parameter, $\pi^*$, although these characteristics are not sufficient, since they are also present in dimethyl sulfoxide ("DMSO") which is inefficient at dispersing SWNTs (Ausman et al., J. Phys. Chem. B 104:8911 (2000)).

A variety of experimental methods can be employed in the fabrication of SWNTs (i.e. arc-discharge, chemical vapor deposition, and pulsed laser vaporization). However, each technique produces SWNTs with differing diameter, chirality distributions, and various amounts of synthesis by-products (Dai, Surf. Sci. 500:218 (2002)). In general, the by-products are the principal component of the as-produced materials or raw SWNT "soot." By-products such as graphitic and amorphous carbon phases, metal catalysts, fullerenes, and carbonaceous coatings on the SWNTs may not only dominate the physical characteristics of the raw soot, but they also pose significant challenges in any subsequent purification (Chiang et al., J. Phys. Chem. B 105:1157 (2001); Chiang et al., J. Phys. Chem. B 105:8297 (2001); Dillon et al., Adv. Mater. 11:1354 (1999); Dillon et al., Mater. Res. Soc. Symp. Proc. 633:A5.2.1 (2001); Harutyunyan et al., J. Phys. Chem. B 106:8671 (2002); Moon et al., J. Phys. Chem. B 105:5677 (2001); Strong et al., Carbon 41:1477 (2003)). Further development of SWNT-based applications is expected to require material standardization, specifically with respect to electronic type and degree of purity. Consequently, there is a need to develop a method whereby the types, amount, and morphology of SWNT-containing materials can be accurately and precisely quantified (Arepalli et al., Carbon 42:1783 (2004)).

The present invention is directed to overcoming these and other deficiencies in the art.

SUMMARY OF THE INVENTION

One aspect of the present invention relates to a dispersion of nanostructured carbon in an organic solvent, where the organic solvent contains an alkyl amide compound having the structure:

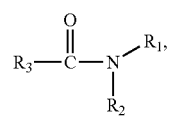

where
R$_1$ and R$_2$ are independently selected from the group consisting of H, C$_1$-C$_6$ alkyl, and phenyl and
R$_3$ is selected from the group consisting of H, C$_1$-C$_6$ alkyl, phenyl, and

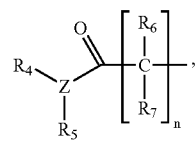

where
Z is N or CH;
R$_4$, R$_5$, R$_6$, and R$_7$ are independently selected from the group consisting of H, C$_1$-C$_6$ alkyl, and phenyl; and
n is an integer from 1 to 3, provided that when R$_1$ and R$_2$ are methyl, R$_3$ is not H.

Another aspect of the present invention relates to a method of dispersing nanostructured carbon in an organic solvent. This method involves providing nanostructured carbon and contacting the nanostructured carbon with an organic solvent containing an alkyl amide compound, where the alkyl amide compound has a structure as described above.

A further aspect of the present invention relates to a method of mobilizing nanostructured carbon. This method involves providing a dispersion of nanostructured carbon in an organic solvent, where the organic solvent contains an alkyl amide compound having a structure as described above. An electrical field is applied to the dispersion under conditions effective to mobilize the nanostructured carbon.

Yet another aspect of the present invention relates to a dispersion of nanostructured carbon in an organic solvent, where the organic solvent contains a diamide compound having the structure:

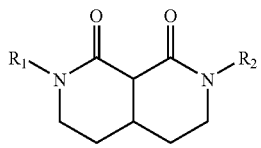

where $R_1$ and $R_2$ are independently selected from $C_1$-$C_6$ alkyl and phenyl.

Yet a further aspect of the present invention relates to a method of dispersing nanostructured carbon in an organic solvent. This method involves providing nanostructured carbon and contacting the nanostructured carbon with an organic solvent containing a diamide compound, where the diamide compound has a structure as described above.

Still another aspect of the present invention relates to a method of mobilizing nanostructured carbon. This method involves providing a dispersion of nanostructured carbon in an organic solvent, where the organic solvent contains a diamide compound having a structure as described above. An electrical field is applied to the dispersion under conditions effective to mobilize the nanostructured carbon.

Still a further aspect of the present invention relates to a method of determining purity of nanostructured carbon. This method involves providing a dispersion of nanostructured carbon in an organic solvent, where the organic solvent contains an alkyl amide compound having a structure as described above. The dispersion is subjected to a solution-phase analysis under conditions effective to determine the purity of the nanostructured carbon.

Another aspect of the present invention relates to a method of determining purity of nanostructured carbon. This method involves providing a dispersion of nanostructured carbon in an organic solvent, where the organic solvent contains a diamide compound having a structure as described above. The dispersion is subjected to a solution-phase analysis under conditions effective to determine the purity of the nanostructured carbon.

The present invention relates to dispersion compositions of as-produced raw and purified laser-generated nanostructured carbon, as well as mixtures thereof, with several alkyl amide and diamide solvents. An improvement in the dispersion limit can be obtained in comparison with solvents DMF and NMP. The dispersion compositions of the present invention provide the ability to achieve well-resolved optical absorption spectra for nanostructured carbon characterization, with corresponding higher extinction coefficients for purified materials. Additionally, the present invention relates to applications such as solution phase chromatography, scattering studies, and organic reaction chemistry using the dispersion compositions of the present invention. The use of stable nanostructured carbon/organic solvent dispersions in optical absorption spectroscopy allows for a quantitative solution-phase analysis. Selection of an appropriate organic solvent permits homogeneous sampling without chemical functionalization and simple sample recovery.

BRIEF DESCRIPTION OF THE DRAWINGS

FIGS. 1a-b are scanning electron microscopy ("SEM") images of laser generated raw SWNT soot (FIG. 1a) and purified, >95% w/w SWNTs (FIG. 1b). The thermogravimetric analysis ("TGA") overlay in FIG. 1c shows the thermal decomposition profile of FIG. 1a and FIG. 1b in air at a ramp rate of 5° C./min.

FIG. 2a is a photograph of the prepared 6.25 µg/mL SWNT-solvent dispersions used to generate the optical absorption data shown in FIG. 2b. The colorless sample vial on the left is pure N,N-dimethylacetamide ("DMA"), (1) is raw SWNTs in DMA, (2) is raw SWNTs in N,N-dimethylpropanamide ("DMP"), (3) is raw SWNTs in DMF, and (4) is raw SWNTs in DEA. The gray bands in FIG. 2b depict the energy transition range for the current SWNT diameter distribution. The arrows designate the absorption maxima at 1.27 and 1.77 eV, corresponding to the second semiconducting and first metallic electronic transitions, respectively.

FIGS. 3a-b are Beer's Law plots for each prepared SWNT-solvent dispersion at 1.27 eV (FIG. 3a) and 1.77 eV (FIG. 3b). The dispersion limit is estimated from the smooth curve fit at the last data point before the inflection, and is designated by the vertical dashed lines. The linear trendline (---) generated using the four lowest concentrations for the DMF dispersion series is provided to illustrate its dispersion limit. The experimental error is within the limits of the data points.

FIG. 6 is an optical absorption spectra for (1) purified SWNTs sprayed on quartz from acetone solution and (2) purified SWNTs in DMA. Improvement in the peak resolution is distinctly observed for the DMA dispersion compared to the dry solid.

FIGS. 7a-c are SEM images at a magnification of 50,000× for purified SWNTs before (FIG. 7a) and after (FIG. 7b) dispersion in DMA. FIG. 7c is a high magnification image of FIG. 7b at 200,000×.

FIG. 9 is a graph showing a dispersion limit curve for purified SWNT-TMMA dispersions derived from the peak maxima values in the optical absorption data.

FIGS. 10a-b are SEM images of deposited SWNTs onto Copper electrodes after 30 minutes at a bias of 300 V/m from a 1 μg/mL SWNT-DMA dispersion.

FIGS. 24a-b are graphs showing rapid purity assessment methods on L-SWNT and A-SWNT constructed sample sets using the peak sum of the absorbance maxima at $^SE_{22}$ and $^ME_{11}$ (FIG. 24a) and slope from the tie lines between absorbance maxima at $^SE_{22}$ and $^ME_{11}$ (FIG. 24b). The linear curve fits indicate the empirical relationships for each method and SWNT synthesis type. The data sets have been normalized to 1 μg SWNTs/mL DMA.

FIGS. 25a-b are graphs showing rapid purity assessment methods on the L-SWNT and A-SWNT constructed sample sets using the maximum absorbance value for the $^SE_{22}$ peak normalized to 1 μg SWNTs/mL DMA (FIG. 25a); and the ratio of absorbance values for the $^SE_{22}$ and $^ME_{11}$ peaks (FIG. 25b). The linear curve fits indicate the empirical relationships for each method and SWNT synthesis type.

DETAILED DESCRIPTION OF THE INVENTION

Figure 4:
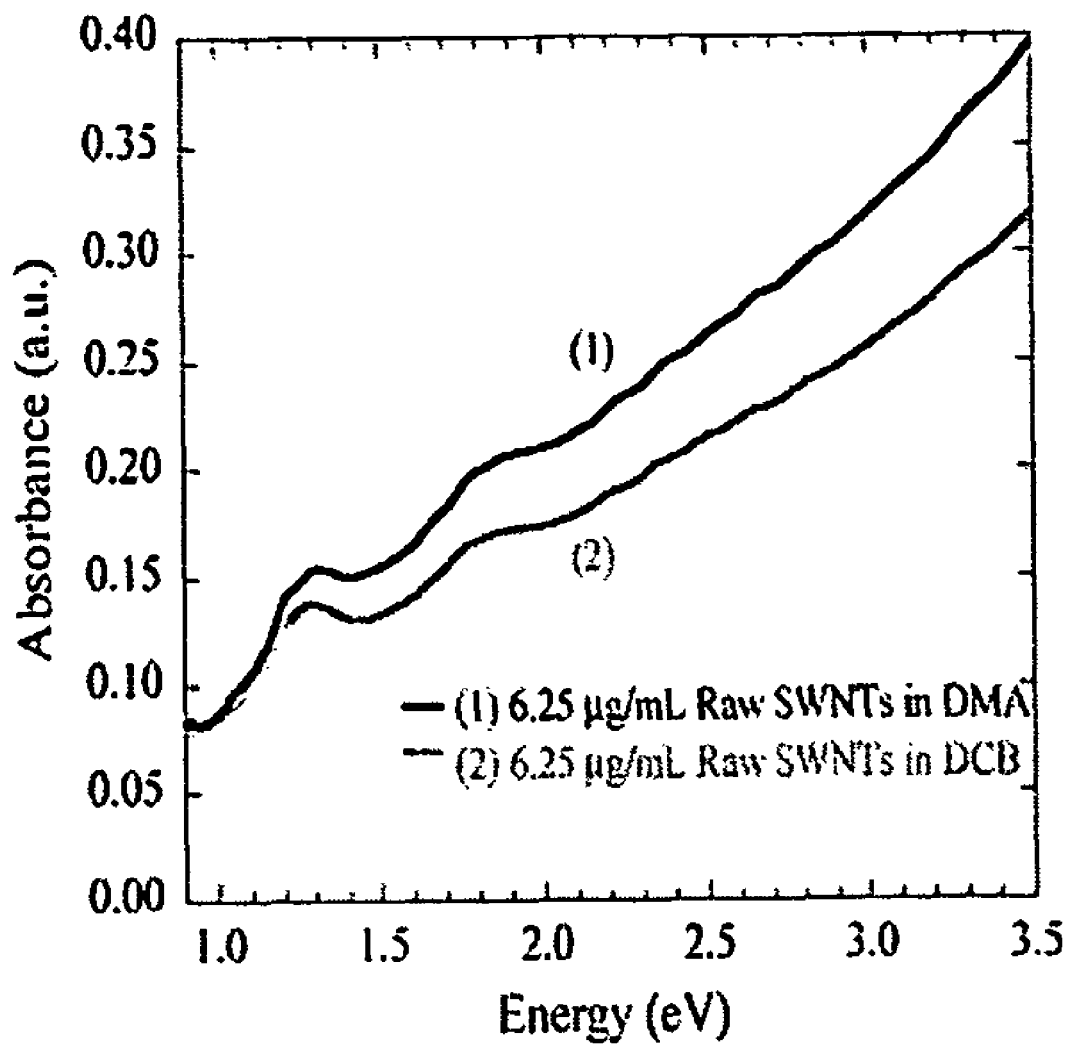
FIG. 4 is an optical absorption spectra for stable SWNT dispersions at a prepared concentration of 6.25 µg/mL for DMA (1) and DCB (2).

One aspect of the present invention relates to a dispersion of nanostructured carbon in an organic solvent, where the organic solvent contains an alkyl amide compound having the structure:

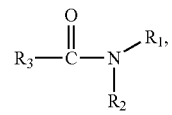

where
$R_1$ and $R_2$ are independently selected from the group consisting of H, $C_1$-$C_6$ alkyl, and phenyl and
$R_3$ is selected from the group consisting of H, $C_1$-$C_6$ alkyl, phenyl, and

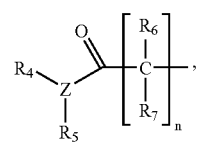

where

Z is N or CH;

$R_4$, $R_5$, $R_6$, and $R_7$ are independently selected from the group consisting of H, $C_1$-$C_6$ alkyl, and phenyl; and n is an integer from 1 to 3, provided that when $R_1$ and $R_2$ are methyl, $R_3$ is not H.

In a preferred embodiment, the alkyl amide compounds of the present invention have the above structure where $R_1$, $R_2$, and $R_3$ are independently selected from $C_1$-$C_6$ alkyl and phenyl. Even more preferably, the alkyl amide compound is one or more of the following compounds:

DMA (N,N-dimethylacetamide) having the structure:

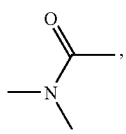

DMP (N,N-dimethylpropanamide) having the structure:

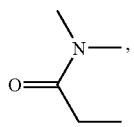

or N,N-diethylacetamide ("DEA") having the structure:

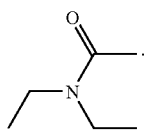

In an alternative embodiment, $R_3$ of the alkyl amide compound of the dispersion of the present invention is preferably

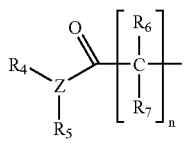

and $R_1$, $R_2$, $R_4$, and $R_5$ are independently selected from $C_1$-$C_6$ alkyl and phenyl. Even more preferably, Z is CH and n is 1.

A particularly preferred alkyl amide compound of this embodiment includes, without limitation, N,N-dimethylacetoacetamide having the structure:

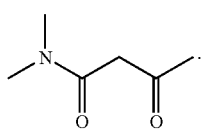

In another embodiment, $R_3$ of the alkyl amide compound of the dispersion of the present invention is preferably

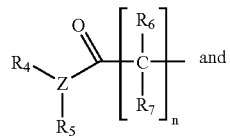

$R_1$, $R_2$, $R_4$, and $R_5$ are independently selected from $C_1$-$C_6$ alkyl and phenyl;

Z is N and n is 1.

Particularly preferred alkyl amide compounds of this embodiment of the dispersion of the present invention include, without limitation, N,N,N',N'-tetramethylmalonamide having the structure:

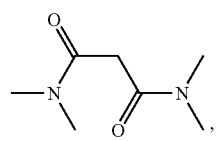

N,N'-dibutyl-N,N'-dimethylmalonamide having the structure:

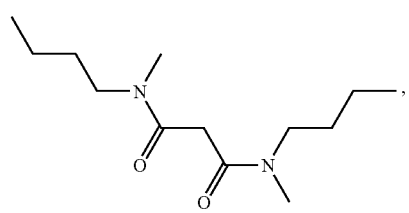

N,N,N',N'-tetra(isopropyl)malonamide having the structure:

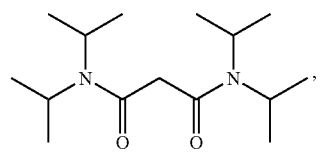

N,N,N',N'-tetrahexylmalonamide having the structure:

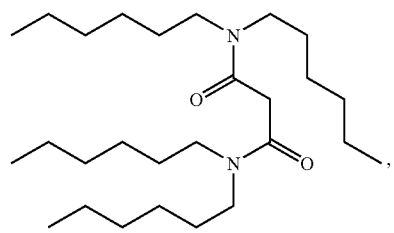

2-methyl-N,N,N',N'-tetrahexylmalonamide having the structure:

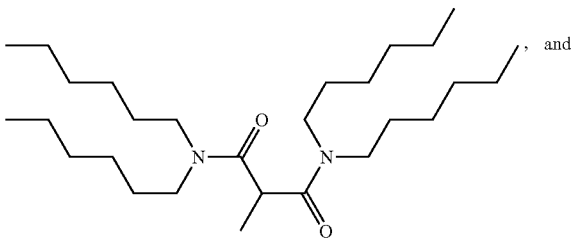

, and

N,N,N',N'-tetrahexyl-2,2-dimethylmalonamide having the structure:

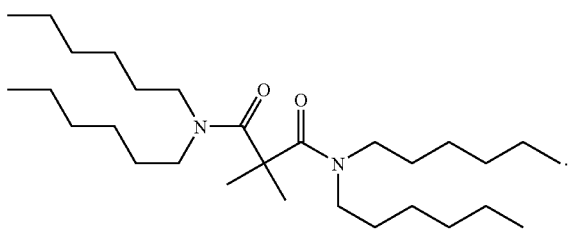

Dispersions of the present invention are preferably stable dispersions which, in a preferred embodiment, do not contain external functionalization agents such as polymers, surfactants, and amines to assist in dispersing the nanostructured carbon in the organic solvent. The dispersions are, in a preferred embodiment, stable for about a day or, more preferably, are stable for about two days to a week or, even more preferably, are stable for more than a week and up to several weeks.

For purposes of the present invention, nanostructured carbon is raw nanostructured carbon soot, purified nanostructured carbon, or mixtures thereof. Nanostructured carbon exists in a variety of forms including, but not limited to, carbon nanotubes, nano-onions, nano-horns, and fullerenes. In a preferred embodiment, the nanostructured carbon is in the form of carbon nanotubes, such as single wall carbon nanotubes (SWNTs), double wall carbon nanotubes, multi-wall carbon nanotubes, or mixtures thereof. Most preferable, the nanostructured carbon is in the form of SWNTs.

Nanostructured carbon can be obtained commercially or prepared by a variety of synthetic routes known and practiced by those of ordinary skill in the art. The synthesis of nanostructured carbon can be accomplished in a wide variety of methods that involve the catalytic decomposition of a carbon containing gas or solid. Some of the most common techniques for the synthesis of carbon nanotubes, fullerenes, nanohorns, etc. are chemical vapor deposition, arc-discharge, and laser vaporization synthesis. The synthesis conditions (e.g., temperature, pressure, carrier gas, etc.), metal catalyst type (most commonly iron, nickel, cobalt, or yttrium), and carbon source (graphite or hydrocarbon) have all been shown to influence the properties of the resulting carbon materials.

Nanostructured carbon dispersed by an alkyl amide solvent may be in more than one form. For example, it may be desirable to form a dispersion of nanostructured carbon containing two or more forms of nanostructured carbon. In a preferred embodiment, SWNTs are combined with amorphous nanostructured carbon to form a dispersion of the present invention. It may be desirable to combine SWNTs made in a synthesis reactor with a metal catalyst with amorphous nanostructured carbon made in the same reactor without the metal catalyst. It may be also be desirable to disperse nanostructured carbon in more than one form in predetermined mass ratios.

Another aspect of the present invention relates to a method of dispersing nanostructured carbon in an organic solvent. This method involves providing nanostructured carbon and contacting the nanostructured carbon with an organic solvent containing an alkyl amide compound, where the alkyl amide compound has a structure as described above.

Nanostructured carbon dispersed by an organic solvent according to the present invention, can be rendered mobile in solution under specific conditions. Preferably, two electrodes are placed opposite each other in a container that also contains the nanostructured carbon dispersion. An electric field is then applied between the electrodes. The nanostructured carbon will migrate in the solution to one or both electrodes after sufficient time according to solvent properties (i.e., dielectric constant) and solution temperature.

Thus, a further aspect of the present invention relates to a method of mobilizing nanostructured carbon. This method involves providing a dispersion of nanostructured carbon in an organic solvent, where the organic solvent contains an alkyl amide compound having a structure as described above. An electrical field is applied to the dispersion under conditions effective to mobilize the nanostructured carbon.

In a preferred embodiment, the mobilized nanostructured carbon is deposited onto a substrate. Preferably, the substrate is a metal electrode or a doped semiconductor.

Yet another aspect of the present invention relates to a dispersion of nanostructured carbon in an organic solvent, where the organic solvent contains a diamide compound having the structure:

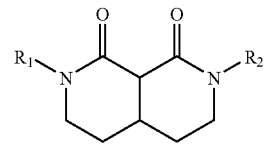

where $R_1$ and $R_2$ are independently selected from $C_1$-$C_6$ alkyl and phenyl.

In a preferred embodiment, $R_1$ and $R_2$ of the diamide compound are methyl.

Yet a further aspect of the present invention relates to a method of dispersing nanostructured carbon in an organic solvent. This method involves providing nanostructured carbon and contacting the nanostructured carbon with an organic solvent containing a diamide compound, where the diamide compound has a structure as described above.

Still another aspect of the present invention relates to a method of mobilizing nanostructured carbon. This method involves providing a dispersion of nanostructured carbon in an organic solvent, where the organic solvent contains a diamide compound having a structure as described above. An electrical field is applied to the dispersion under conditions effective to mobilize the nanostructured carbon.

Still a further aspect of the present invention relates to a method of determining purity of nanostructured carbon. This method involves providing a dispersion of nanostructured carbon in an organic solvent, where the organic solvent contains an alkyl amide compound having a structure as described above. The dispersion is subjected to a solution-phase analysis under conditions effective to determine the purity of the nanostructured carbon.

Solution-phase analysis can be performed on constructed sample sets that vary the mass fraction of a purified component with respect to a representative carbonaceous impurity. The spectroscopic data from these sample sets allow for numerous mathematical approaches to be applied in reference to a known metric of comparison. The application of a nonlinear regression model using a Lorentzian subtraction of the π-plasmon, as well as multiple rapid assessment protocols using the interband electronic transitions (e.g., absolute absorbance intensity, peak maxima ratio, tie line slope, and a Beer's law analysis derived from calculated extinction coefficients) has been developed for SWNTs and is described in detail in the Examples below.

In a preferred embodiment, determining the purity of nanostructured carbon involves applying a nonlinear regression of the nanostructured carbon π-plasmon. Alternatively, determining the purity of nanostructured carbon involves using experimental extinction coefficients of the nanostructured carbon materials.

Suitable solution phase analyses include, without limitation, spectroscopy, optical absorption, fluorescence, nuclear magnetic, EPR, Raman, mass spectrometry, and chromatography. In a preferred embodiment, the solution phase analysis for carrying out the methods of the present invention is optical absorption spectroscopy.

Determining the purity of nanostructured carbon may be particularly useful when more than one type of nanostructured carbon is contained in a sample. For example, it may be desirable to determine the purity of SWNTs in a sample containing SWNTs mixed with amorphous nanostructured carbon. Such mixtures may be made in predetermined mass ratios as described above.

Another aspect of the present invention relates to a method of determining purity of nanostructured carbon. This method involves providing a dispersion of nanostructured carbon in an organic solvent, where the organic solvent contains a diamide compound having a structure as described above. The dispersion is subjected to a solution-phase analysis under conditions effective to determine the purity of the nanostructured carbon.

EXAMPLES

Example 1

SWNT Synthesis, Characterization, and Purification

SWNTs were synthesized using the pulse laser vaporization technique, employing an Alexandrite laser (755 nm) (Gennett et al., *Mater. Res. Soc. Symp. Proc.* 633:A9.1.1-A9.1.11 (2001), which is hereby incorporated by reference in its entirety). The laser pulse was rastered using GSI Lumonics mirrors over the surface of a graphite (1-2 μm) target doped with 2% w/w Ni (sub-μm) and 2% w/w Co (<2 μm), at an average power density of 100 W/cm$^2$. The reaction furnace temperature was held at 1150° C., with a chamber pressure of 700 torr under 100 sccm flowing $Ar_{(g)}$. The raw SWNT soot was collected from the condensed region on the quartz tube at the rear of the furnace. Synthesis of a representative nanostructured carbon component in the raw soot was performed by laser vaporization at the described conditions for an undoped graphite target. The nanostructured carbon material was devoid of SWNTs detectable by SEM, Raman, or optical absorption spectroscopies.

Analysis of SWNTs was performed by SEM, Raman spectroscopy, and TGA. SEM was conducted using a Hitachi S-900, with samples applied directly to the brass stub using silver paint. The instrument operated at an accelerating voltage of 2 kV and magnifications ranged from 5000× to 250000×. Raman spectroscopy was performed at room temperature using a JY-Horiba Labram spectrophotometer with excitation energies of 1.96 and 2.54 eV. These energies have been shown to probe the metallic and semiconducting laser-generated SWNTs, respectively, over the range of diameters used (Kataura et al., *Synth. Met.* 103:2555 (1999), which is hereby incorporated by reference in its entirety). Sample spectra were obtained from 50 to 2800 cm$^{-1}$ using an incident beam attenuation filter to eliminate localized heating and subsequent sample decomposition. TGA was conducted using a TA Instruments 2950. Samples were placed in the platinum pan balance in quantities of ~1 mg and ramped at 5° C./min from room temperature up to 950° C. under air at a gas flow rate of 60 sccm and $N_{2(g)}$ balance purge at a gas flow rate of 40 sccm.

Purification of SWNT soot was performed using a modification of a previously reported procedure (Dillon et al., *Adv. Mater.* 11:1354-1358 (1999), which is hereby incorporated by reference in its entirety). Approximately 50 mg of raw SWNT soot was brought to reflux at 125° C. in 3M nitric acid for 16 hours, and then filtered over a 1 μm PTFE membrane filter with copious amounts of water. The filter paper was rinsed consecutively with acetone, ethanol, 2.5 M NaOH, and $H_2O$ until filtrate became colorless after each step. The membrane filter was dried at 70° C. in vacuo to release the resulting SWNT paper from the filter paper. The SWNT paper was thermally oxidized in air at 550° C. for 1 minute in a Thermolyne 1300 furnace. Finally, a 6M Hydrochloric acid wash for 60 minutes using magnetic stirring, with similar filtering steps and thermal oxidation at 550° C. for 20 minutes, completed the purification. SEM and TGA analyses were conducted during the purification process to assure that the quality of the purification was at least 95% w/w SWNTs. In some cases, a post-purification annealing step has been employed at 1100° C. under flowing $Ar_{(g)}$, which is expected to remove structural defects and surface functionalization (Martinez et al., *Carbon* 41:2247 (2003), which is hereby incorporated by reference in its entirety).

Example 2

SWNT-Solvent Dispersion Preparation

Stable dispersions of SWNTs in the evaluated solvents were achieved using a three-step process. Initially, stock solutions of 0.100 mg SWNTs/mL solvent were prepared and ultrasonicated (38.5-40.5 kHz) for 30 minutes at 40° C. Serial dilutions with pure solvent were made to achieve the desired concentrations of 12.5, 6.25, 3.13, 1.56, 0.781, and 0.391 μg/mL. The ultrasonication step was performed prior to transferring each aliquot to the subsequent dilution. Next, each concentration was centrifuged at 5,000 rpm for 10 min to remove any potentially nondispersed material. The supernatant was decanted and analyzed using optical absorption spectroscopy.

Example 3

Optical Absorption Spectroscopy

UV-vis-near-IR spectra were obtained using a Perkin-Elmer Lambda 900 spectrophotometer. Sample handling for dispersion solutions involved the use of 1 cm quartz cuvettes, while dry SWNT samples were air sprayed from a 0.1 mg/mL acetone solution onto 1 in² quartz slides. The instrument scanned over a wavelength range of 300-1600 nm at a data interval of 1 nm. In the near-IR range, the instrument scan speed was 375 nm/minute, with an integration time of 0.16 seconds, a 1.0 nm slit, and gain set at 1. For the UV-vis region, the scan speed was 375 nm/minute, with an integration time of 0.12 seconds, a 4.0 nm slit, and the gain set at 1.

It is well established that the diameter and electronic type of SWNTs are responsible for the unique set of transitions present in optical absorption spectroscopy (Kataura et al., *Synth. Met.* 103:2555 (1999), which is hereby incorporated by reference in its entirety). The characteristic position of the absorption peaks correspond to abrupt changes in the electronic density of states, or Van Hove singularities. The ith pair of discrete electronic transition energies corresponding to these singularities is approximated by the following:

$$^{S,M}E_{ii} = 2na_{c-c}\gamma_0/d_{SWNT}$$

where n is an integer, having values of 1, 2, 4, 5, or 7 for semiconducting (S) SWNTs and n=3 or 6 for metallic (M) SWNTs in the spectral range of interest (Lian et al., *J. Phys. Chem. B* 107:12082 (2003), which is hereby incorporated by reference in its entirety), $a_{c-c}$ is the carbon-carbon bond distance with a value of 0.142 nm, and $d_{SWNT}$ is the SWNT diameter (Odom et al., *Nature* 391:62 (1998); Wildoer et al., *Nature* 391:59 (1998), which are hereby incorporated by reference in their entirety). The carbon-carbon overlap integral, $\gamma_0$, for SWNTs has been reported to range from 2.45 to 3.0 eV (Hagen et al., *Nano Lett.* 3:383 (2003), which is hereby incorporated by reference in its entirety). The electronic transitions probed in this optical absorption analysis are $^{S}E_2$, $^{M}E_{11}$, $^{S}E_{33}$, $^{S}E_{44}$, and $^{M}E_{22}$, due to the absorption windows of the alkyl amide solvents.

Initially, characterization of the raw and purified SWNT materials was performed by SEM, TGA, and Raman spectroscopy. Shown in FIG. 1a is a representative SEM image of raw SWNT soot, with the distinguishing characteristics of amorphous carbon and metal catalyst impurities surrounding the SWNT bundles. FIG. 1b shows an SEM image of the sample after the purification process, evident by the removal of the synthesis impurities. The TGA thermogram (see FIG. 1c) indicates two prominent decomposition temperatures for the raw SWNT soot at 450 and 553° C., with a metal oxide residue of 7.5% w/w. These decomposition temperature values are determined from the peak maxima of the first derivative plots. The TGA data for the purified SWNTs shows a single decomposition temperature at 677° C. with a metal oxide residue of 3.7% w/w. On the basis of these data and an analysis using optical absorption spectroscopy (Itkis et al., *Nano Lett.* 3:309 (2003), which is hereby incorporated by reference in its entirety), it is estimated that the raw soot is ~30% w/w SWNTs and the purified SWNTs is of a purity that is at least 95% w/w. Raman spectroscopy of the laser-generated SWNTs has shown the presence of both metallic and semiconducting SWNTs, each within a diameter range of 1.2 to 1.4 nm, on the basis of peak assignments of the radial breathing mode with the previously established relationship between the Raman shift and SWNT diameter (Dresselhaus et al., *Carbon* 40:2043 (2002), which is hereby incorporated by reference in its entirety).

The ability to produce SWNT dispersions was first evaluated using a single batch of raw SWNT soot with the following alkyl amide solvents: NMP, DMF, DMA, DEA, and DMP. The stability of these dispersions was assessed after ultrasonication, centrifugation, and decantation steps. Optical absorption spectra were obtained for each prepared dispersion concentration to establish the dispersion limit using Beer's Law plots (Strong, *Anal. Chem.* 24:338 (1952), which is hereby incorporated by reference in its entirety). This enabled both qualitative analysis of the dispersion limit for each solvent based on the presence of sediment after centrifugation and quantitative analysis using the absorbance measurements for each prepared dispersion concentration. In contrast to the previous report, NMP was inefficient at dispersing the raw SWNT soot after these processing steps. Shown in FIG. 2a is a picture of the SWNT-solvent dispersions used during analysis, at a prepared concentration of 6.25 µg/mL. The corresponding optical absorption overlay for these SWNT-solvent dispersions is represented in FIG. 2b. The variation in absorbance intensity can be attributed to each solvent's ability to disperse the raw SWNT soot. The largest absorbance and most well-resolved spectrum were exhibited by the SWNT-DMA dispersion. The peaks corresponding to the electronic transitions for semiconducting ($^{S}E_{22}$, $^{S}E_{33}$, and $^{S}E_{44}$) and metallic ($^{M}E_{11}$) SWNTs are highlighted by the gray bands (Lian et al., *J. Phys. Chem. B* 107:12082 (2003), which is hereby incorporated by reference in its entirety). For this diameter distribution, the peak maxima for $^{S}E_{22}$ and $^{M}E_{11}$ occur at 1.27 and 1.77 eV, respectively. These selected energies were used to generate dispersion limit curves from each SWNT-solvent dispersion series.

The Beer's Law plot in FIG. 3a shows the absorbance measurements at 1.27 eV for SWNT-solvent dispersions over the concentration range examined. The dispersion limit can be estimated from the plot by generating a smooth curve fit (Kaleidagraph) and observing the point at which the data deviates from a linear trendline. The extent of the "knee" in the inflection point can be attributed to density variation between solvents, with DMF having the highest density (0.944 g/mL) and DEA having the lowest (0.925 g/mL). Therefore, since DMF has the smallest inflection, a linear trendline was generated from the four lowest concentrations to better illustrate its dispersion limit. Additionally, it is observed that the absorbance values continue to increase after the inflection point, resulting from the non-SWNT carbonaceous materials present in raw soot that is dispersed in these solvents. The results for the estimated dispersion limits of raw SWNT soot in each solvent are summarized in Table 1, but the general trend is as follows: DMA>DMP>DEA>DMF. The same trend was observed for absorbance measurements at 1.77 eV (FIG. 3b), indicating that the dispersions are not type sensitive, but include both metallic and semiconducting SWNTs. The dispersion limit values are listed as the last data point which was consistent with a linear trendline at an $R^2=0.999$. In fact, the dispersion limit for DMA was a factor of four higher than that for DMF, (i.e. 6.25 µg/mL compared to 1.56 µg/mL), an improvement over previous reports using DMF (Ausman et al., *J. Phys. Chem. B* 104:8911 (2000); Krupke et al., *J. Phys. Chem. B* 107:5667 (2003), which are hereby incorporated by reference in their entirety). The dispersion limit curves from the Beer's Law plot were corroborated by the presence of sediment after centrifugation for the concentrations which deviated from the linear trendline. SEM analysis of the sediment showed a morphology which was indistinguishable from the raw SWNT soot, evident by the presence of SWNTs, amorphous carbon, and metal catalyst impurities. The stability of the SWNT-alkyl amide solvent dispersions was observed to range from 12-24 hours for concentrations near the dispersion limit, but on the order of days to a week for concentrations in the linear region of the Beer's Law plot. The highest stability was observed for DMA, in agreement with the dispersion limit trend.

TABLE 1

Experimental Results for Dispersion Limit ($D_L$) Estimations and Extinction Coefficients of Raw SWNTs in Alkyl Amide Solvents, Including the Reported Dielectric Constants

| Solvent | $D_L$ (raw SWNTs) (µg/mL) | $\epsilon_{1.27\,eV}$ (raw SWNTs) (mL·mg$^{-1}$·cm$^{-1}$) | $\epsilon_{1.77\,eV}$ (raw SWNTs) (mL·mg$^{-1}$·cm$^{-1}$) | dielectric constant |
|---|---|---|---|---|
| DMF | 1.56 | 23.4 | 30.0 | 37.06 |
| DMA | 6.25 | 23.8 | 31.2 | 38.30 |
| DBA | 3.13 | 24.2 | 31.3 | 31.33 |
| DMP | 3.13 | 26.1 | 34.7 | 33.08 |

Previous work using DCB gives a higher dispersion limit of 95 µg/mL for raw HiPco, using a filtration method for estimating the dispersion limit (Bahr et al., *Chem. Commun.* 2:193 (2001), which is hereby incorporated by reference in its entirety). A comparison on the use of DCB and DMA to disperse raw SWNT soot has been performed. The same SWNT concentration series used above was prepared for DCB and DMA through ultrasonication at 40° C. No visual aggregates were observed in either solvent's solution for the 6.25 µg/mL prepared concentration. However, the presence of non-dispersed particles was observed in both solvents for the 12.5 µg/mL prepared concentrations. Unfortunately, due to the higher density of DCB (1.306 g/mL) compared to DMA (0.937 g/mL), the centrifugation technique was unsuccessful at removing the non-dispersed particles in DCB. In addition, filtration in the presence of glass wool was seen to introduce variability in the absorption spectra of the resulting dispersions, possibly arising from the glass wool packing density and SWNT interactions during elution. Shown in FIG. 4 is an overlay of the optical absorption spectra for the stable DCB and DMA dispersions at 6.25 µg/mL. The differences in absorbance values can be attributed to solvent effects, most notably the index of refraction for the individual solvents ($\eta^{20}_{DCB}$=1.551 and $\eta^{20}_{DMA}$=1.438) (Skoog et al., *Principles of Instrumental Analysis*, 5$^{th}$ ed., Harcourt Brace & Co., Philadephia, Pa. (1998), which is hereby incorporated by reference in its entirety). Also, a blue shift of 22 meV was observed for the absorption maximum in the DMA dispersion compared to the DCB dispersion, indicating a slight solvatochromic shift based on a difference in the electronic interactions between SWNTs and these two solvents. DCB and DMA show similar dispersion limits ($D_L$) of 6.25≦$D_L$<12.5 µg/mL for the raw SWNT soot, as compared to the previously reported value of 95 µg/mL. This may be attributed to differences in the SWNT materials used, as well as the limited data set in the previous report, which may artificially inflate the dispersion limit values due to a contribution from non-SWNT carbon (Bahr et al., *Chem. Commun.* 2:193 (2001), which is hereby incorporated by reference in its entirety). Differences in the diameter distribution averages (that for HiPco is 1.0 nm, which is less than that for the laser, 1.37 nm) are well known (Chattopadhyay et al., *J. Am. Chem. Soc.* 125:3370 (2003), which is hereby incorporated by reference in its entirety), but physical properties such as bundling, defect density, and purity are more difficult to establish. The fact that both DCB and DMA show the ability to form stable SWNT dispersions indicates that a set of structural and electronic properties exists for these solvents, which are capable of interacting favorably with the SWNTs. A recent report has shown that sonochemical polymerization of DCB enhances the dispersing ability of this solvent, but that this effect is not present with DMF solutions (Niyogi et al., *J. Phys. Chem. B* 107:8799 (2003), which is hereby incorporated by reference in its entirety). Similarly, DMA was evaluated before and after ultrasonication and there was no observed change in the infrared spectrum even after an exposure time of 4 hours. Therefore, the sonochemical polymerizations previously observed with DCB are not suggested to be responsible for the stabilization of SWNTs in alkyl amide solvents.

Evaluation of the Beer's Law plots for the absorption maxima of the raw SWNT-alkyl amide solvent dispersions has enabled the determination of extinction coefficients. The values listed in Table 1, display a general trend for both semiconducting (1.27 eV) and metallic (1.77 eV) transitions, i.e. DMP>DEA≈DMA>DMF. This trend parallels the electron donating character of the alkyl groups attached to the carbonyl of the amide. In addition, when the results for DEA and DMA are compared, the alkyl group present on the nitrogen shows a smaller, but consistent, increase in the extinction coefficient. As is common with alkenes, the substituents on the solvents will thermodynamically stabilize the double bond character in the resonance stabilized amide, which leads to stabilization of the electronic dipole moment in the solvents, and in turn influences the interaction with an SWNT. This explanation is supported by the data, which shows a 10-15% increase in the extinction coefficient for DMP compared to DMF. Such a change is significant, since the difference in the index of refraction for DMP ($\eta^{20}_{DMP}$=1.440) and DMF ($\eta^{20}_{DMF}$=1.431) would not account for the absorbance increases. The apparent solvent interaction appears to increase the probability of electronic transitions in the SWNTs, resulting in the larger extinction coefficients, although no apparent solvatochromic shift is observed among the four alkyl amide solvents for dispersions of raw soot. The importance of electron donor character toward stabilizing SWNTs in solution has been cited for DMF (Ausman et al., *J. Phys. Chem. B* 104:8911 (2000), which is hereby incorporated by reference in its entirety). However, the current alkyl amide solvents (DMA, DEA, and DMP) have even greater electron donating ability, leading to higher dispersion capability than observed in DMF. The polarity of these solvents, evident by the dielectric constants (see Table 1), may be an important consideration, since the resulting electronic interaction is largely influenced by changes in the Van der Waals forces of the SWNTs with the solvent molecules. However, similar attempts at dispersing SWNTs using acetonitrile (dielectric constant 36.00) and DMSO (dielectric constant 46.71) (Laurence et al., *J. Phys. Chem. B* 98:5807 (1994), which is hereby incorporated by reference in its entirety) have been unsuccessful, indicating that dispersion capability is not merely a function of polarity. In addition to the dipole-dipole effects, the interaction between alkyl amide solvents and SWNTs may result from increased π orbital overlap or "stacking," (Chen et al., *J. Am. Chem. Soc.* 123:3838 (2001), which is hereby incorporated by reference in its entirety) which is greatest for optimized solvent geometries. For example, the π orbital interaction would be significantly higher for DCB compared to alkyl amide solvents, but the reduced polarity (dielectric constant 10.36) (Laurence et al., *J. Phys. Chem.B* 98:5807 (1994), which is hereby incorporated by reference in its entirety) may account for the equivalent dispersion performance. Therefore, in the case of alkyl amide solvents, the presence of a highly polar π system in conjunction with appropriate bond lengths and bond angles should show the highest SWNT dispersion limit.

To maximize the electronic effects between the alkyl amide solvents and SWNTs, a complementary set of steric properties may be necessary. AM1 theoretical calculations were performed using Chem 3D MOPAC, a general-purpose semiempirical quantum mechanics package, to determine the geometries associated with the alkyl amide solvents (Arora, *Asian J. Chem.* 14:1719 (2002), which is hereby incorporated by reference in its entirety). Table 2 lists the calculated bond lengths and bond angles associated with the amide linkage. In addition, experimental values from gas electron diffraction ("GED") are provided for corroboration of the theoretical results for DMF and DMA (Schultz et al., *J. Phys. Chem.* 97:4966 (1993); Mack et al., *J. Am. Chem. Soc.* 119:3567 (1997), which are hereby incorporated by reference in their entirety). The overall values show good agreement with the structural characteristics described previously for SWNTs (Wildoer et al., *Nature* 391:59 (1998), which is hereby incorporated by reference in its entirety). The calculated carbon-carbon bond length in an SWNT is 1.42 Å, while the bond angle is 120°. These results are suggestive of a potential π orbital stacking between the solvent and SWNTs, which is expected to be sensitive to these geometries. The alkyl amide solvent which exhibits the most favorable structural alignment to the carbon-carbon bonding in an SWNT is DMA. Therefore, it is proposed that the highest SWNT dispersion limit observed in DMA is a result of the highly polar π system which structurally contains an optimal geometry for interaction with the SWNT backbone.

TABLE 2

MOPAC AM1 Theoretical Calculations for the Bond Length and Bond Angles of Alkyl Amide Solvents*

| Solvent | C=O Bond Length (Å) | C—N Bond Length (Å) | R—C=O Bond Angle | N—C=O Bond Angle |
|---|---|---|---|---|
| DMF | 1.242 (1.224) | 1.380 (1.391) | 122.678° (119.5°) | 122.909° (123.5°) |
| DMA | 1.249 (1.226) | 1.388 (1.368) | 120.260° (123.1°) | 119.979° (121.0°) |
| DEA | 1.248 | 1.392 | 120.245° | 120.419° |
| DMP | 1.247 | 1.391 | 121.762° | 120.164° |

*Experimental values from gas electron diffraction (GED) studies are listed in parentheses with appropriate references.

Figure 5:
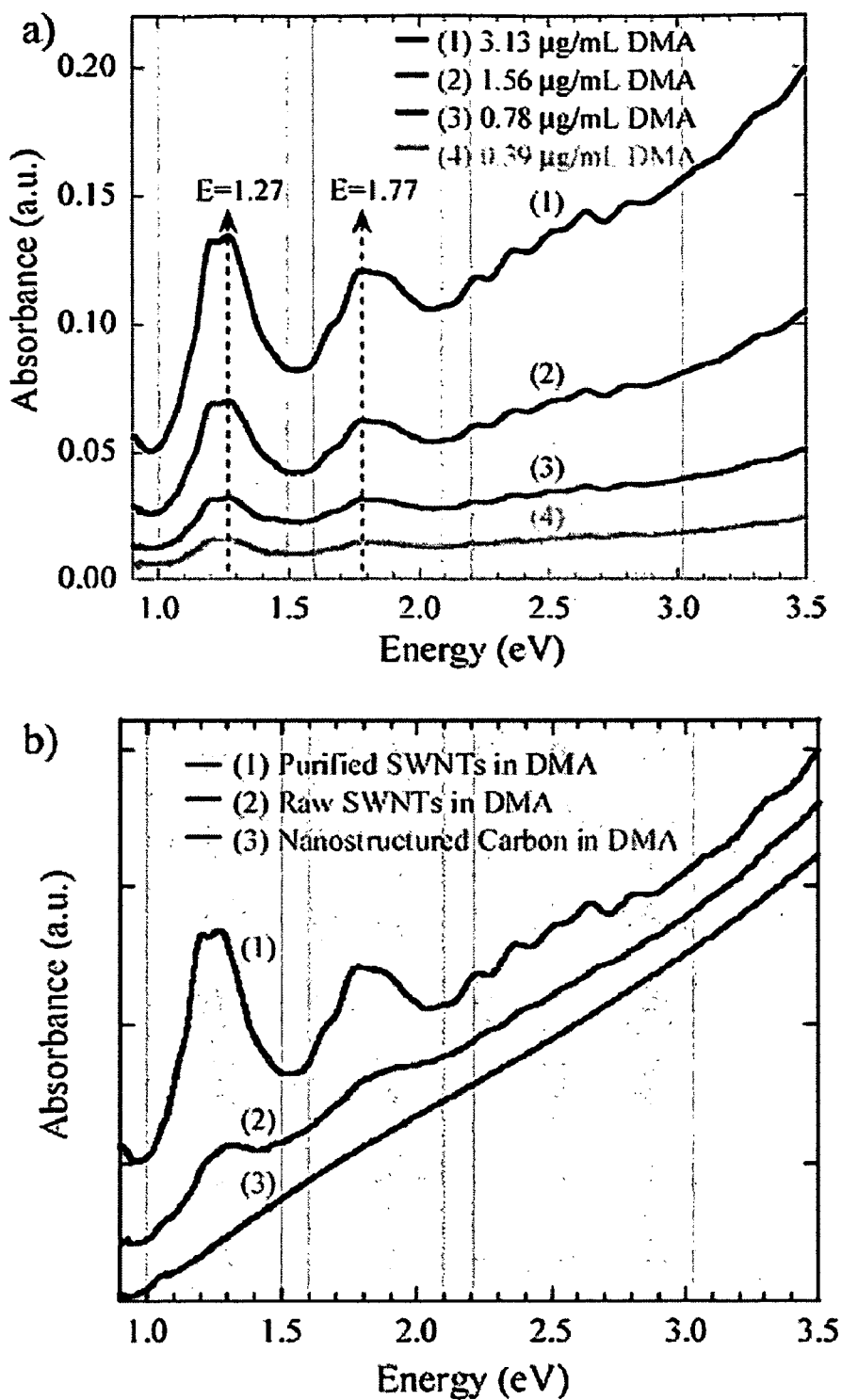
FIG. 5a is an optical absorption spectra of purified SWNT-DMA dispersions for the series of concentrations used to generate the Beer's Law analysis.
FIG. 5b is an optical absorption spectra comparing the relative absorbance intensity of (1) purified SWNTs, (2) raw SWNT soot, and (3) nanostructured carbon in DMA. The spectra, offset for clarity, were all obtained from 3.13 µg/mL concentrations. The gray bands in FIG. 5a and FIG. 5b depict the energy transition range for the current SWNT diameter distribution.

Following the same protocol which was used with raw soot, purified SWNTs were dispersed in DMA, and the corresponding optical absorption spectra were obtained. Selection of DMA was based upon it having the highest observed dispersion limit for the raw SWNT soot. Shown in FIG. 5a is an overlay of the spectra used for Beer's Law analysis to calculate the estimated dispersion limit and extinction coefficients. The purified SWNT dispersion limit was determined to be 3.13 µg/mL in DMA, on the basis of the described method. The presence of carboxylic acid groups from the nitric acid processing (Chen et al., *J. Phys. Chem. B* 105:2525 (2001), which is hereby incorporated by reference in its entirety) on the purified SWNTs may influence the dispersion in DMA. However, purified-annealed SWNTs showed similar dispersion limits. The extinction coefficients for purified SWNTs in DMA were calculated to be 43.4 and 39.0 mL·mg$^{-1}$·cm$^{-1}$ at 1.27 and 1.77 eV, respectively. Summarized in Table 3 are the dispersion limit and extinction coefficient results comparing the purified SWNTs with raw SWNT soot and nanostructured carbon. The characteristic differences in absorption properties for each of these carbon-based materials can be observed in the spectral overlay shown in FIG. 5b. The relationship between absorption intensity and peak resolution for the SWNT transitions can be directly related to the SWNT mass fraction of a sample. The calculated extinction coefficients can be used to estimate the relative SWNT concentration in a laser-generated sample for the established diameter distribution and semiconducting-to-metallic ratio. It is important to recognize that the magnitude of the extinction coefficient is dependent on both the solvent effects (Table 1) and SWNT sample purity (Table 3). Other potential SWNT physical properties that may influence the extinction coefficients include diameter, length, and bundling effects. These considerations may account for the variation in extinction coefficients reported thus far for SWNTs (Bahr et al., *Chem. Commun.* 2:193 (2001); Zhou et al., *J. Phys. Chem. B* 107:13588 (2003), which are hereby incorporated by reference in their entirety).

TABLE 3

Experimental Results for Dispersion Limit ($D_L$) Estimations and Extinction Coefficients of Raw, Purified, and Nanostructred Carbon Materials Dispersed in DMA

| Solute | $D_L$ (µg/mL) | $\epsilon_{1.27\ eV}$ (mL·mg$^{-1}$·cm$^{-1}$) | $\epsilon_{1.77\ eV}$ (mL·mg$^{-1}$·cm$^{-1}$) |
|---|---|---|---|
| raw | 6.25 | 23.8 | 31.2 |
| purified | 3.13 | 43.4 | 39.0 |
| nano-structured carbon | 325 | 15.7 | 25.2 |

An important advantage to SWNT-solvent dispersions over other dispersing strategies is the ability to easily remove the solvent through evaporation and recover the starting material. The optical absorption overlay shown in FIG. 6 depicts the differences in purified SWNTs air sprayed from acetone onto a quartz slide (dry solid) and purified SWNTs dispersed in DMA. The enhanced resolution of the SWNT transitions for the DMA dispersion may be attributed to a debundling effect, in analogy with optical absorption spectra of surfactant stabilized SWNTs (O'Connell et al., *Science* 297:593 (2002), which is hereby incorporated by reference in its entirety). This implies that smaller bundles or individual SWNTs are present in the DMA dispersion (O'Connell et al., *Science* 297:593 (2002), which is hereby incorporated by reference in its entirety). Additionally, SEM images were obtained from SWNTs that were forced to aggregate into bundles from a DMA dispersion by solvent evaporation, prior to analysis. The results for purified SWNTs before and after dispersion in DMA indicate the presence of bundles for both cases, albeit the precipitated SWNTs appear to have a more straightened, "relaxed" structure (FIG. 7). Therefore, the dispersion process appears to suspend the SWNTs without apparent damage to the underlying structure. The dispersion results described here are not unique to purified laser-generated SWNTs; similar dispersion behavior in DMA using purified HiPco (Chiang et al., *J. Phys. Chem. B* 105:8297 (2001), which is hereby incorporated by reference in its entirety) has also been demonstrated.

The capability for a series of alkyl amide solvents to disperse as-produced raw and purified SWNTs has been evaluated. Characterization using optical absorption spectroscopy has enabled calculation of the dispersion limit and extinction coefficients for the laser generated semiconducting and metallic SWNTs. The highly polar π system and optimal geometries of the alkyl amide solvents are proposed to be the factors responsible for the dispersion of SWNTs. The best dispersion of the solvents studied was in DMA, which also corresponded to the best combination of steric and electronic factors. These SWNT-DMA dispersions proved to be stable for days to even weeks. The optical absorption spectra generated from these dispersions showed well-resolved fine structure, presumably due to debundling. Production of stable SWNT dispersions without the use of any external agent (i.e. surfactant, polymer, amine, etc.) emerges as a powerful strategy towards probing the properties of nanostructured carbon, such as SWNTs. Specifically, the extinction coefficients for purified nanostructured carbon can be used to monitor the relative SWNT mass fraction during the purification process. Ultimately, the use of nanostructured carbon-solvent dispersions in electrophoretic separations may lead to phase pure SWNTs on the basis of diameter and type.

Example 4

Nanostructured Carbon-Diamide Dispersions

Figure 8:
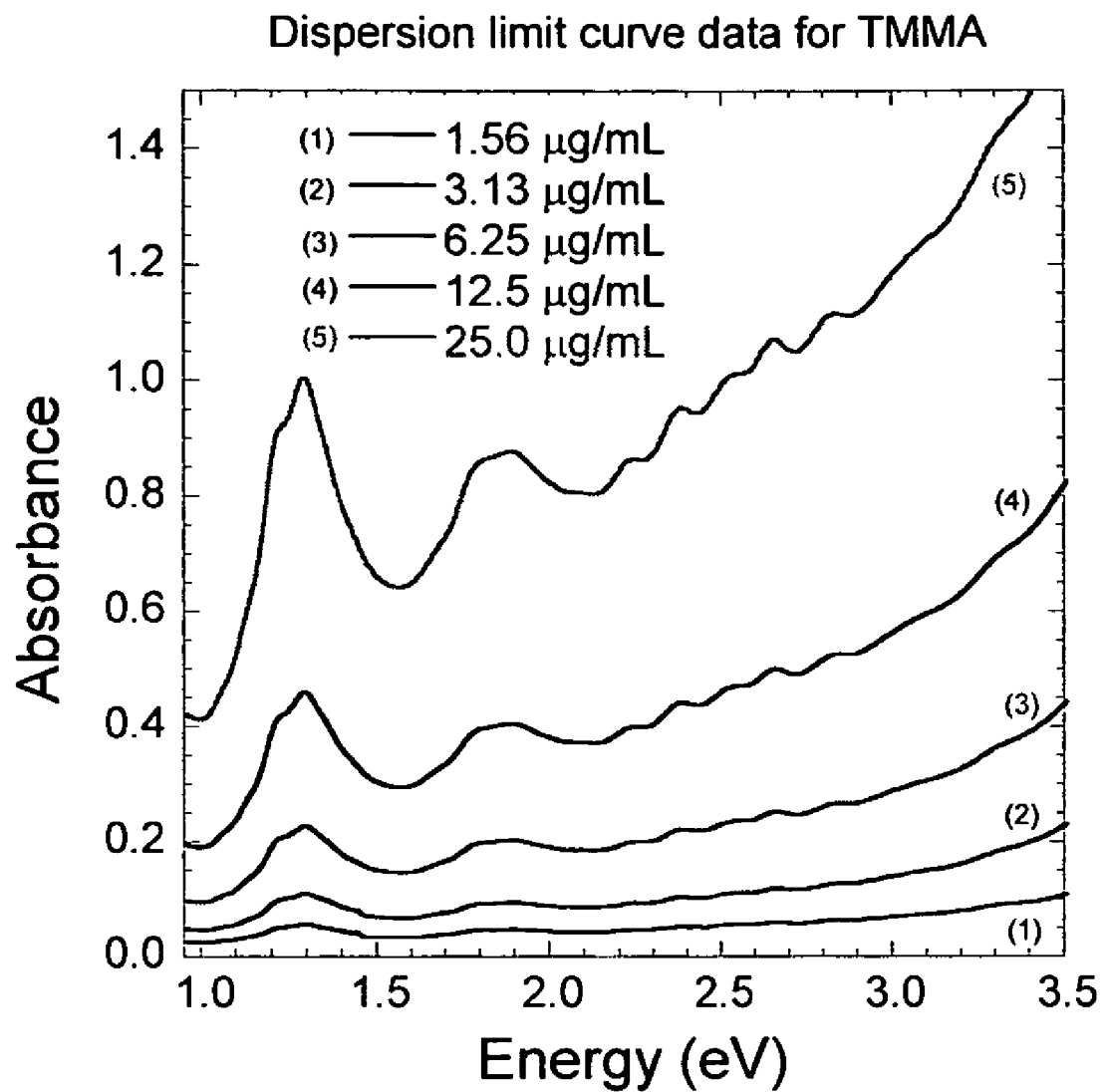
FIG. 8 is a graph showing optical absorption data for a dispersion of purified SWNT in N,N,N',N'-tetramethyl-malonamide ("TMMA").

In addition to the alkyl amide solvents described above, diamide compounds have been verified to efficiently disperse carbon nanotubes. N,N,N'N'-tetramethylmalonamide (TMMA) has been shown to disperse purified SWNTs at a concentration >25 µg/mL. The optical absorption data for purified SWNTs in TMMA over a series of concentrations is set forth in FIG. 8. The corresponding values at the peak maxima for each concentration were plotted in FIG. 9 to establish the dispersion limit results as described above. The results show that TMMA is capable of dispersing SWNTs at a concentration >25 µg/mL since the data points do not deviate from the linear trendline indicative of a true Beer's law relationship.

Example 5

Electrophoretic Separation of SWNTs in Organic Solvents

A 1 µg/mL SWNT-DMA dispersion was placed in a glass U-tube (10 cm pathlength) containing 15 mL of pure DMA. Two copper electrodes were inserted at the ends of the U-tube and a 30 V bias was placed between them, resulting in a field of 300 V/m. The electrode where the dispersion was pipetted was the negative electrode and the positive electrode was where the extracts were removed. Initial attempts evaluated the positive copper electrode to ensure that the SWNTs were being electrophoretically promoted through the DMA solution and attracted to the positive electrode. The result as seen in the SEM image of FIGS. 10a-b is that the SWNTs were depositing on the copper electrode within 30 minutes.

Figure 11:
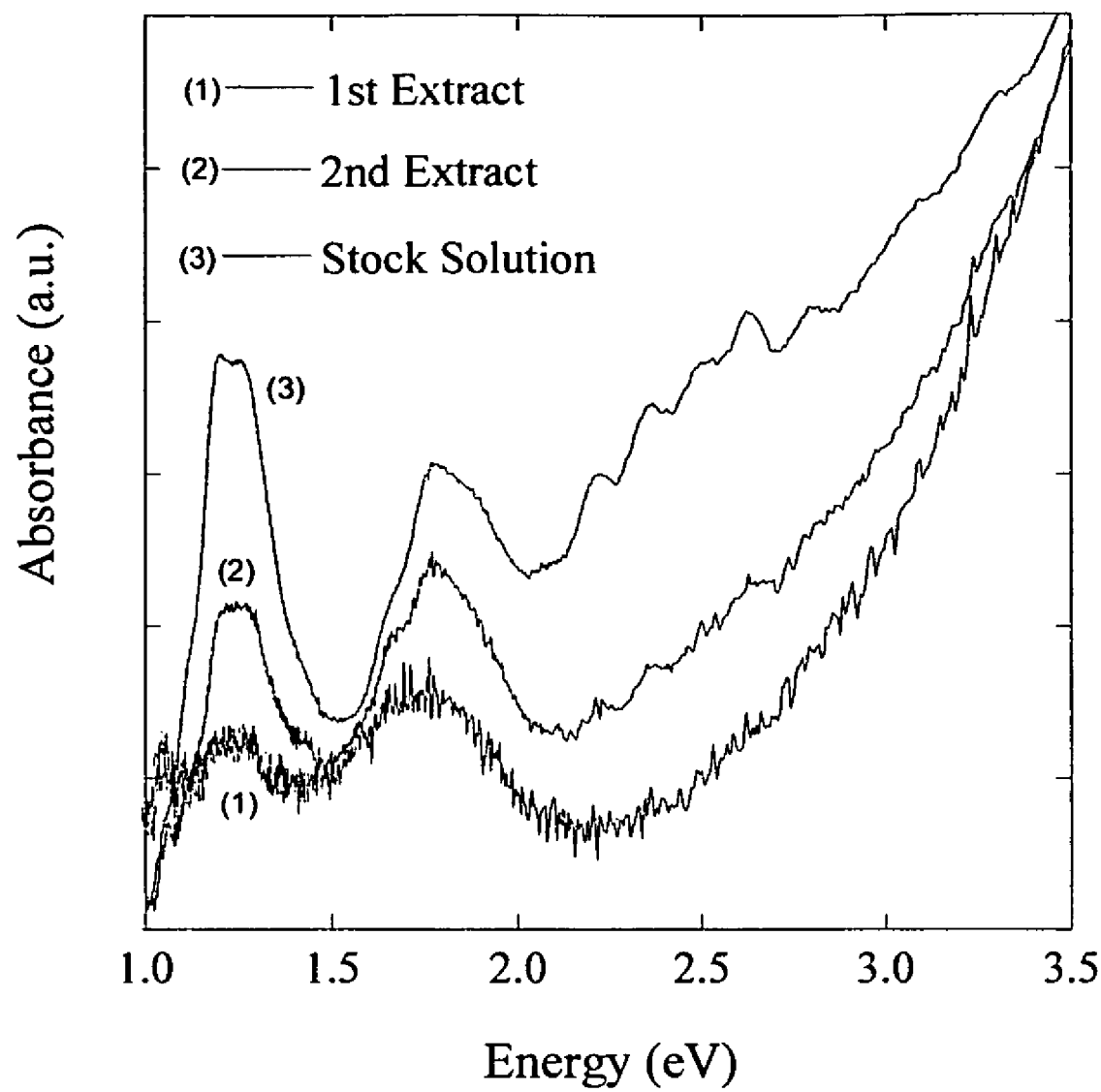
FIG. 11 is an optical absorption spectra for a 1 μg/mL stock solution of purified SWNTs in DMA. The overlay consists of extracted samples from an electrophoretic separation of the stock solution under an applied field of 30 minutes and 60 minutes. The change in peak ratio ($A_{1.27\ eV}/A_{1.77\ eV}$) from stock solution to the 1$^{st}$ extract indicates a significant shift in the semiconducting/metallic ratio of the SWNTs in solution.
Figure 12:
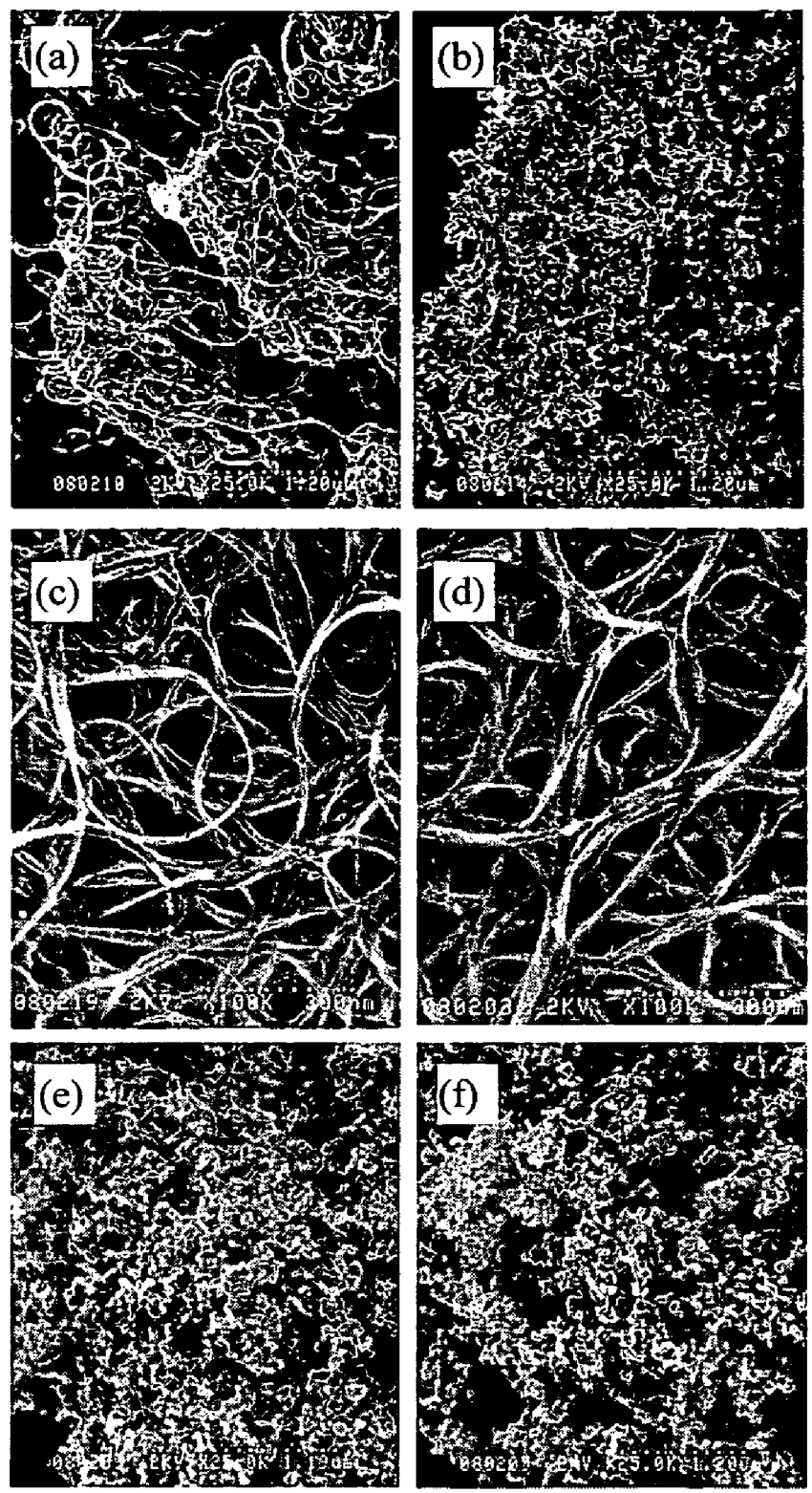
FIGS. 12a-f are SEM images for raw SWNTs synthesized using the pulsed laser vaporization technique ("L-SWNT") soot (FIG. 12a); raw arc-discharged SWNTs ("A-SWNT") soot (FIG. 12b); purified L-SWNTs (FIG. 12c); purified A-SWNTs (FIG. 12d); nanostructured carbon (FIG. 12e); and carbon soot (FIG. 12f). The magnifications for FIGS. 12a, 12b, 12e, and 12f are 25000×. The magnifications for FIGS. 12c and 12d are 100000×.

The next series of experiments involved removing volumetric extracts (~1 mL) and determining the changes in the optical absorption spectra, which is a direct measure of the concentration and electronic types (semiconducting and metallic) in solution. The data in FIG. 11 illustrates the distinct spectral features of SWNTs with the peak at 1.27 eV arising from the electronic transitions in semiconducting SWNTs and the one at 1.77 eV from metallic SWNTs. The results from the two extracts after 30 and 60 minutes are that the absorbance peak ratio is dramatically different than the stock solution. Based on the ratio of absorbance values, the approximate degree of "enrichment" in metallic types compared to the stock solution is from 40% in the stock to 60% in the first extract. Extract 1 shows the largest enrichment due to the higher mobility in metallic SWNTs which is due to their larger inherent dielectric constant. The second extract is still metallically-enriched, but the results suggest that after an hour, semiconducting species also move with sufficient mobility to be extracted at the positive electrode. The peaks from 2.1 eV and up represent both semiconducting and metallic transitions and are in qualitative agreement with the enrichment observations, but are not a good measure of the degree of enrichment.

Example 6

Purity Assessment of SWNTs, Using Optical Absorption—Synthesis and Purification

SWNTs were synthesized using the pulsed laser vaporization technique (L-SWNTs), employing an Alexandrite laser (755 nm). The laser pulse was rastered (corner to corner over 1 $cm^2$ with 50% overlap of 100 µs pulses at a repetition rate of 10 Hz) over the surface of a graphite (1-2 micron) target doped with 2% w/w Ni (submicron) and 2% w/w Co (<2 micron), at an average power density of 100 W/$Cm^2$. The reaction furnace temperature was maintained at 1150° C., with a chamber pressure of 700 torr under 100 sccm flowing Ar in a 46 mm inner diameter (50 mm outer diameter) quartz tube (Landi et al., *J. Phys. Chem. B* 108:17089 (2004), which is hereby incorporated by reference in its entirety). Synthesis of a representative nanostructured carbon component in the raw L-SWNT soot was performed by laser vaporization at the described conditions for an undoped graphite target. For comparison of material properties and purity assessment protocols from commercial sources, a batch of arc-discharge SWNTs (A-SWNTs) was purchased from Carbon Solutions, Inc (Riverside, Calif.). The corresponding non-SWNT carbon representative of the arc-discharge process was used in the form of carbon soot, made from the resistive heating of graphite rods, and purchased from Aldrich (St. Louis, Mo.).

Purification of both L- and A-SWNT raw soots was performed based on a previously reported procedure (Landi et al., *J. Phys. Chem. B* 108:17089 (2004), which is hereby incorporated by reference in its entirety). In summary, 50-100 mg of each raw SWNT soot was brought to reflux at 120° C. in 3M nitric acid for 16 hours, and then filtered over a 1 µm PTFE membrane filter with copious amounts of water. The membrane filters were dried at 70° C. in vacuo to release the resulting SWNT papers from the filter paper. The L-SWNT paper was thermally oxidized in air at 450° C. for 1 hour in a Thermolyne 1300 furnace, followed by a 6M hydrochloric acid wash for 30 minutes using magnetic stirring, equivalent filtering steps, and a final oxidation step at 550° C. for 1 hour. In the case of the A-SWNTs, a sequential series of thermal oxidations at 450, 525, and 600° C. occurred for 1 hour each, with intervening 6M HCl acid wash and filtering steps being performed. The typical purification yield for the laser raw soot was 10% w/w and the arc raw soot was 2% w/w. However, concern for the quality of purified material was a larger consideration than optimization of this purification process.

Example 7

Material Characterization

Characterization of the SWNTs, nanostructured carbon, and carbon soot was performed by SEM, Raman spectroscopy, and TGA. The SEM was performed at 2 kV using a Hitachi S-900, with samples applied directly to the brass stub using silver paint. Raman spectroscopy was performed at room temperature using a JY-Horiba Labram spectrophotometer from 100-2800 $cm^{-1}$ with excitation energies of 1.96 eV (He/Ne) and 2.54 eV (Ar). These energies have been shown to probe both the metallic and semiconducting SWNTs, respectively, over the range of diameters for L- and A-SWNTs used in this study (Dresselhaus et al., *Carbon* 40:2043 (2002), which is hereby incorporated by reference in its entirety). TGA was conducted using a TA Instruments 2950. Samples were placed in the platinum pan balance in quantities of ~1 mg and ramped at 10° C./min from room temperature up to 950° C. under air at a gas flow rate of 60 sccm.

Example 8

Optical Absorption and Constructed Sample Sets

UV-vis-NIR spectra were obtained on stable dispersions of SWNTs, nanostructured carbon, and carbon soot in DMA and an air sprayed sample on a quartz slide from a 0.1 mg/mL SWNT-acetone solution using a Perkin Elmer Lambda 900 spectrophotometer (Landi et al., *J. Phys. Chem. B* 108:17089 (2004), which is hereby incorporated by reference in its entirety). Sample handling for dispersion solutions involved the use of 1 cm quartz cuvettes. Data was obtained over an energy range of 0.90-4.25 eV, corresponding to the transmission window of the alkyl amide solvent. Given the fact that the spectrophotometer is only measuring optical transmittance during these measurements, the possibility exists that scattering in the dispersions will affect the absorption data. Although the effects of particle scattering are quite pronounced on sprayed SWNT samples (>30%) (Lebedkin et al., *J. Phys. Chem.* 107:1949 (2003), which is hereby incorporated by reference in its entirety), previous reports indicate that scattering on SWNT dispersions is negligible at concentrations of 10 μg/mL in DMF (Itkis et al., *Nano Lett.* 3:309 (2003), which is hereby incorporated by reference in its entirety) and 20 μg/mL in aqueous surfactant dispersions (Lebedkin et al., *J. Phys. Chem.* 107:1949 (2003), which is hereby incorporated by reference in its entirety). Therefore, the dispersion concentration employed presently of 2.5 μg/mL should exhibit even less spectral distortion due to scattering than those reported. The constructed laser sample set was prepared from a volumetric mixture of a 2.5 μg/mL stock solution of purified L-SWNTs in DMA with a 2.5 μg/mL stock solution of nanostructured carbon-DMA in 20% increments (i.e. concentrations of 0%, 20%, 40%, 60%, 80%, and 100% w/w SWNTs). The same procedure was also employed for preparation of the constructed arc sample set with volumetric mixing of a 2.5 μg/mL purified A-SWNT-DMA dispersion with a 2.5 μg/mL stock solution of CS-DMA. The raw L- and A-SWNT soots were also analyzed from 2.5 μg/mL DMA dispersions. Each of these concentrations reflects the mass of carbon containing material calculated from TGA data, adjusting for the relative mass of metal oxides (assuming Ni/Co metal in laser raw soot is 72% and Ni/Y metal in arc raw soot is 75% of the residual oxide value for 50:50 metal catalyst mixtures) as determined by the decomposition residue.

Example 9

Fullerene Extraction

Evaluation of the $C_{60}$ fullerene content in the carbonaceous samples was performed by a toluene extraction and analysis by optical absorption spectroscopy based on the reported extinction coefficient ($\in$=54,200 $M^{-1}$ $cm^{-1}$ at 336 nm for $C_{60}$ in toluene) (Bachilo et al., *J. Phys. Chem.* 105:9845 (2001), which is hereby incorporated by reference in its entirety). The carbonaceous samples were prepared at concentrations of ~0.25 mg/mL in toluene (an order of magnitude below the solubility limit of $C_{60}$ in toluene of 2.8 mg/mL (Dresselhaus et al., *Science of Fullerenes and Carbon Nanotubes*, Academic Press: San Diego, Calif. (1996), which is hereby incorporated by reference in its entirety)) and placed in an ultrasonic bath for 20 minutes at 25° C. After centrifugation for 10 minutes at 5,000 rpm, the supernatant was analyzed to determine the soluble fullerenes content in toluene.

Example 10

Purity Assessment Methods

The accuracy of purity assessment methods can be validated by appropriate characterization with a reference SWNT sample set. The opportunity to acquire a 100% w/w pure SWNT sample is currently not available (Itkis et al., *Nano Lett.* 3:309 (2003), which is hereby incorporated by reference in its entirety), thereby necessitating an alternative reference. A reference sample set has been constructed where various SWNT mass fractions are achieved through the mixtures of purified SWNTs and representative carbonaceous by-products. Purified laser (L-) and arc (A-) SWNTs were prepared by standard purification treatment and shown to possess a high degree of purity and material quality based on conventional microscopy and spectroscopy. The absolute degree of purity of the purified SWNTs is obviously unknown. However, verification of the assessment method is not dependent on the absolute quality of the purified SWNTs, but is based on the correlation of purity estimates with designed fractions in the constructed sample sets. The purity assessment protocols will remain valid even with other reference samples of potentially higher purity (Itkis et al., *Nano Lett.* 3:309 (2003), which is hereby incorporated by reference in its entirety).

Example 11

Material Characterization and Constructed Sample Sets

Initially, microscopic and spectroscopic characterization was performed on the raw SWNTs, purified SWNTs, and representative carbonaceous synthesis impurities (i.e. nanostructured carbon for laser synthesis and carbon soot for arc-discharge synthesis) to identify corresponding sample morphologies and physical properties. Shown in FIGS. 12a-f are the SEM images of (a) raw L-SWNTs, (b) raw A-SWNTs, (c) purified L-SWNTs, (d) purified A-SWNTs, (e) nanostructured carbon, and (f) carbon soot. Evident from the raw L-SWNTs are the highly entangled bundles of SWNTs with the obvious presence of amorphous carbon and metal catalyst impurities. Similar morphologies are seen with the raw A-SWNTs, although the observed quantity of SWNTs is generally lower than in the case of L-SWNTs. The purified SWNTs in both cases show highly ordered, well defined bundles with trace metal particles present. Analysis of the SEM images for nanostructured carbon and carbon soot show nearly identical surface morphology with globular particles and the absence of any carbon nanotube materials. The TGA data shows significantly higher metal catalyst impurities in the raw A-SWNTs compared to the raw L-SWNTs (31.9% w/w vs. 10.2% w/w, respectively). The purified A- and L-SWNTs show residual impurities of 16.9 and 11.7% w/w, respectively, and significantly higher carbonaceous decomposition temperatures compared to the raw soots based on the $1^{st}$ derivative plots (i.e., 730° C. and 767° C., respectively). The nanostructured carbon and carbon soot TGA data show nearly complete carbonaceous decomposition by ~625° C. However, the presence of graphitic material is apparent in the carbon soot with a minor decomposition transition at ~700° C.

Figure 13:
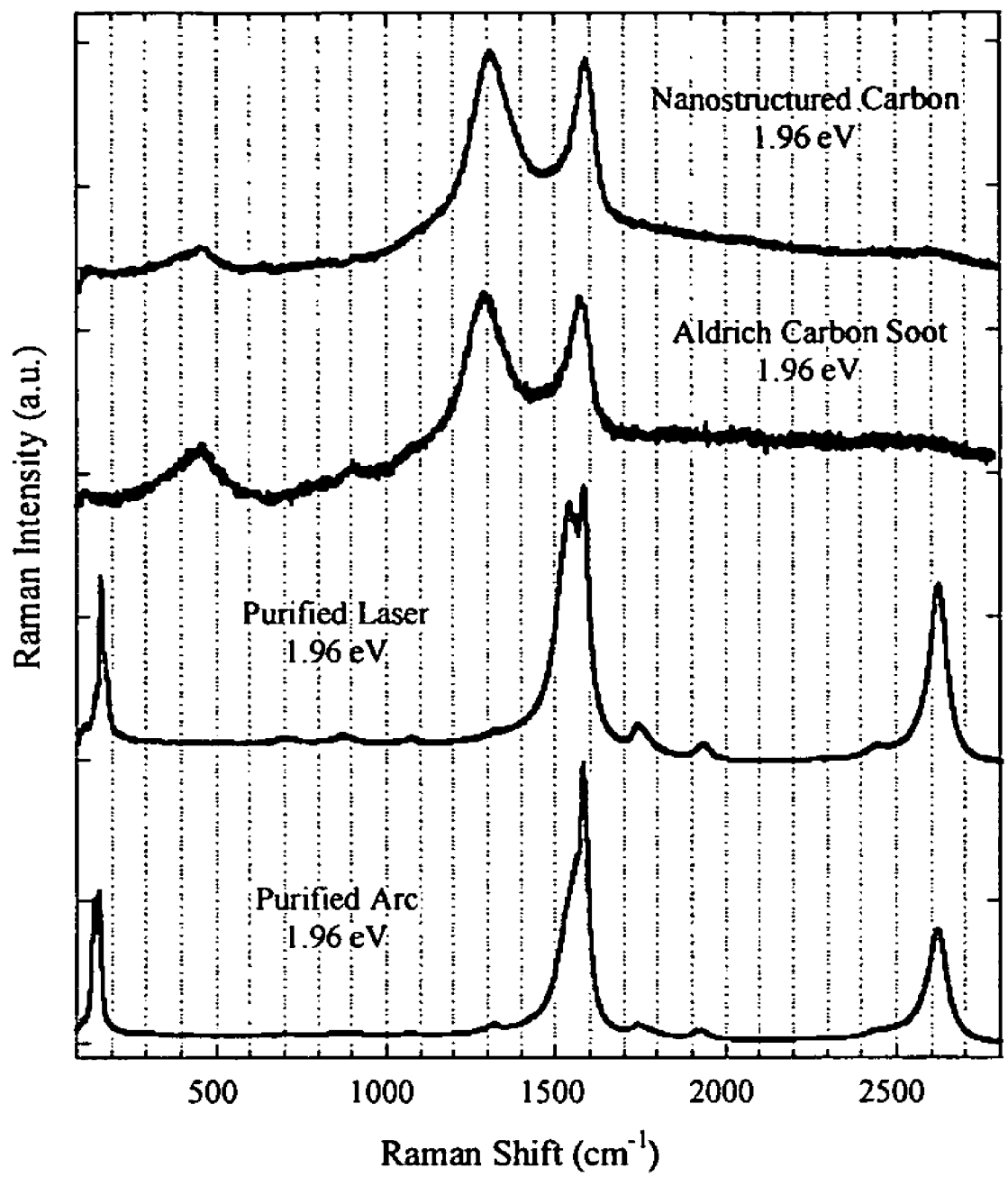
FIG. 13 is a graph showing an overlay of the Raman spectra for nanostructured carbon, carbon soot, purified L-SWNTs, and purified A-SWNTs at an incident laser energy of 1.96 eV.

Raman spectroscopy was performed on each of the material types using a He/Ne 1.96 eV laser and the spectra are shown in FIG. 13. The pronounced D- (~1300 cm$^{-1}$) and G-Bands (~1600 cm$^{-1}$) are evident in the nanostructured carbon and carbon soot samples with a higher relative intensity around 500 cm$^{-1}$ for the carbon soot attributed to increased fullerene content (Dresselhaus et al., *Science of Fullerenes and Carbon Nanotubes*, Academic Press: San Diego, Calif. (1996), which is hereby incorporated by reference in its entirety). This observation was confirmed by the toluene extraction of soluble $C_{60}$ fullerenes where nanostructured carbon and carbon soot contain 2.6% w/w and 3.6% w/w, respectively. The absence of a radial breathing mode ("RBM") (~120-200 cm$^{-1}$) for both nanostructured carbon and carbon soot samples supports the notion that these samples lack any SWNTs. In comparison, the typical spectra for SWNTs is observed in both purified arc and laser with the prominent RBM peaks, G- (~1400-1600 cm$^{-1}$), and G'-Bands (~2600 cm$^{-1}$) being distinctly observed (Dresselhaus et al., *Carbon* 40:2043 (2002), which is hereby incorporated by reference in its entirety). Although the presence of functional groups may exist from an oxidizing acid purification treatment (Hu et al., *J. Phys. Chem. B* 107:13838 (2003), which is hereby incorporated by reference in its entirety), the extremely weak D-Band (~1320 cm$^{-1}$) in the Raman spectra for both purified L- and A-SWNTs is evidence for a high degree of crystallinity and relatively few defects related to functionalization in carbon nanotubes (Dresselhaus et al., *Carbon* 40:2043 (2002); Endo et al., *Appl. Phys. Lett.* 79:1531 (2001), which are hereby incorporated by reference in their entirety). Further analysis of the diameter distributions was made with a complementary Ar laser at 2.54 eV for the purified laser and arc-SWNTs. Using an expression for bundled SWNTs, the corresponding diameter distributions were calculated to range from 1.2-1.5 nm for laser and 1.3-1.6 nm for arc (Rao et al., *Phys. Rev. Lett.* 86:3895 (2001), which is hereby incorporated by reference in its entirety). Thus, these samples exhibit a slight difference in the diameter distribution while still containing both semiconducting and metallic types (Kataura et al., *Synth. Met.* 103:2555 (1999), which is hereby incorporated by reference in its entirety). Overall, based on the microscopic and spectroscopic data, the nanostructured carbon and carbon soot show similar sample morphology and are appropriate representations of carbon impurities (i.e. 0% SWNT samples) for laser and arc-discharge synthesis strategies, respectively. Likewise, the purified L- and A-SWNTs represent a high degree of carbonaceous purity and are further denoted as the "100%" SWNT samples for each synthesis' constructed sample set.

Figure 14:
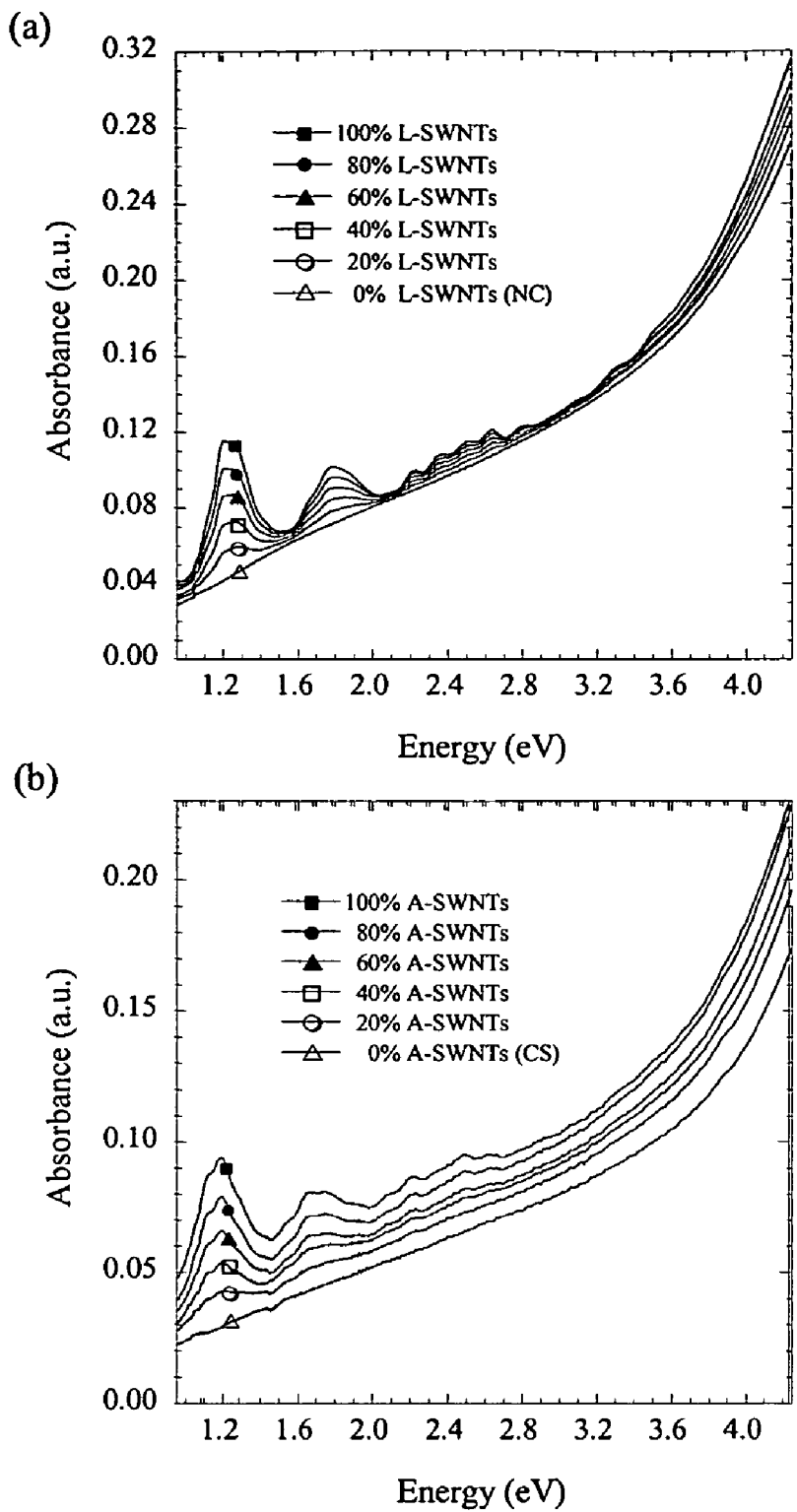
FIGS. 14a-b are optical absorption spectra for constructed sample sets of 2.5 μg/mL DMA dispersions for purified L-SWNTs and nanostructured carbon (NC) (FIG. 14a); and purified A-SWNTs and carbon soot (CS) (FIG. 14b). The data for each sample set depict the highly resolved peaks which are due to the interband electronic transitions associated with the Van Hove singularities in SWNTs.

Constructed sample sets were prepared as previously described by volumetric mixing of stock DMA dispersions of purified SWNTs ("100%") with the respective carbon impurity constituent (nanostructured carbon for laser and carbon soot for arc). However, it should be noted that the choice of carbon impurities will affect the constructed sample sets. Selection of nanostructured carbon is a highly suitable material since it was manufactured in the same laser synthesis reactor. Since an equivalent carbon impurity is currently unavailable from the raw arc SWNT soot vendor, the selection of carbon soot as the most appropriate choice for a representative material has been made because it was produced under similar conditions, albeit from a different vendor. The concentration calculations for the DMA dispersions included adjustment from decomposition residue values from the TGA data such that the resulting 2.5 µg/mL is indicative of the carbonaceous content in the solutions. FIGS. 14a-b display the characteristic optical absorption data for the DMA dispersions over the solvent transmittance window of 0.90 eV to 4.25 eV. Evident from the data are the well resolved peaks due to the electronic transitions associated with the Van Hove singularities in the density of states for SWNTs (Kataura et al., *Synth. Met.* 103:2555 (1999), which is hereby incorporated by reference in its entirety). The two prominent peaks at ~1.2 eV and ~1.7 eV originate from the second interband transitions of semiconducting SWNTs ($^{S}E_{22}$) and first interband transitions of metallic SWNTs ($^{M}E_{11}$), respectively (Kataura et al., *Synth. Met.* 103:2555 (1999); Lian et al., *J. Phys. Chem. B* 107:12082 (2003), which are hereby incorporated by reference in their entirety). The overall absorption in a SWNT-containing sample is a superposition of absorbances due to the interband electronic transitions and background π-plasmons of both the SWNTs and carbon impurities. The dramatic change in absorption intensity as a function of $^{c}w_{SWNTs}$ for both sample sets provides the necessary reference standard for comparison of purity assessment methods.

Example 12

Linear Subtraction Approach

Figure 15:
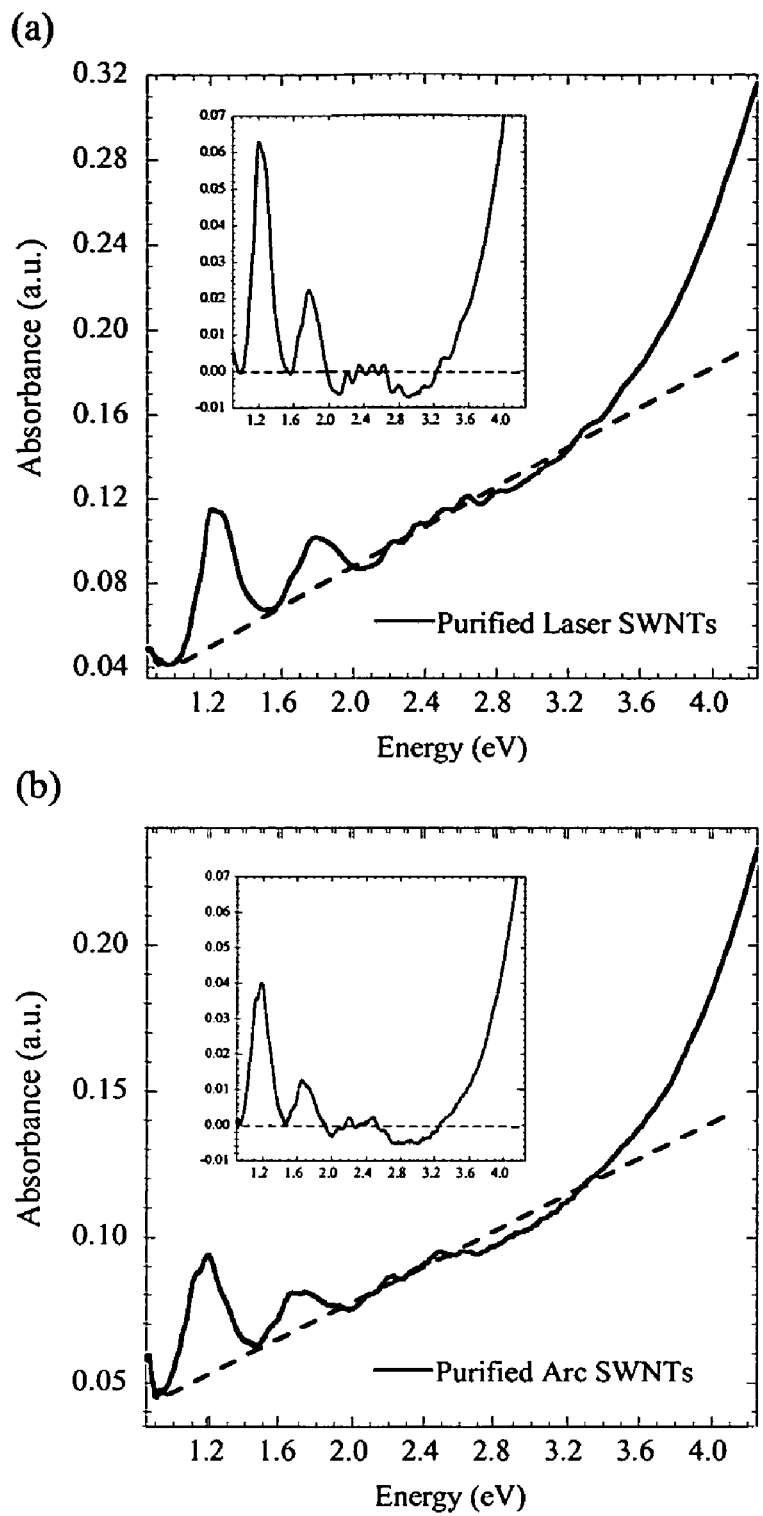
FIGS. 15a-b are optical absorption spectra for 2.5 μg/mL DMA dispersions of purified L-SWNTs (FIG. 15a) and purified A-SWNTs (FIG. 15b). The dashed line depicts a linear extrapolation of the two minima corresponding to the $^SE_{22}$ peak. The insets show the resulting spectra after linear subtraction of the $^SE_{22}$ peak based on the extrapolated line.
Figure 16:
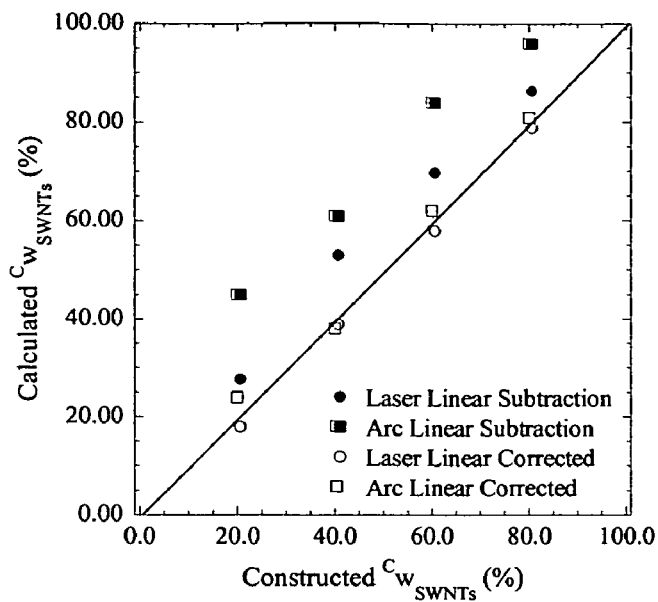
FIG. 16 is a graph showing purity assessment results on the constructed sample sets shown in FIGS. 15a-b for a $^SE_{22}$ linear subtraction with the ratio of areal absorbance to the purified SWNT reference. The closed data points represent the purity assessment results using the equation referenced in the art while the open data points are the corrected values using the equation of the present invention. The straight line represents the expected purity values for the constructed fractions of SWNTs represented in the carbonaceous mass fraction ($^Cw_{SWNTs}$).

Recent attempts at purity assessment have utilized a linear subtraction over selected spectral cutoffs to estimate the absorption from non-SWNT electronic transitions for a SWNT-containing sample (Itkis et al., *Nano Lett.* 3:309 (2003); Hu et al., *J. Phys. Chem. B* 107:13838 (2003); Itkis et al., *J. Phys. Chem. B* 108:12770 (2004); Sen et al., *Chem. Mater.* 15:4273 (2003); Zhao et al., *J. Phys. Chem. B* 108:8136 (2004); Lian et al., *J. Phys. Chem. B* 108:8848 (2004), which are hereby incorporated by reference in their entirety). Application of the method to the current purified SWNTs shows a calculated areal reference ratio for purified laser SWNTs of 0.319 and for purified arc SWNTs equal to 0.253 (Itkis et al., *Nano Lett.* 3:309 (2003), which is hereby incorporated by reference in its entirety). These values are dramatically larger than the reported value of 0.141 for the high purity arc reference sample or the purified sample (EA-P2=0.186), further supporting the quality (Lian et al., *J. Phys. Chem. B* 108:8848 (2004), which is hereby incorporated by reference in its entirety) of the purified SWNTs used in this study. The selection of the dispersion solvent (DMA instead of DMF) cannot be attributed as the main factor in these differences since the extinction coefficients for SWNTs calculated for each solvent vary by less than 2%. Although the constructed sample sets do support the qualitative notion that the peak intensity at $^{S}E_{22}$ is directly related to the SWNT purity, propagation of a linear subtraction beyond the spectral cutoffs fails to accurately reflect the underlying absorption due to the SWNT π-plasmon and other carbonaceous absorption features (see FIGS. 15a-b). Application of the areal ratio of the linearly subtracted $^{S}E_{22}$ peak to the total area over selected spectral cutoffs (0.97 eV-1.53 eV for laser and 0.94 eV-1.47 eV for arc) for the constructed sample sets, significantly deviates from the designed fractions. Shown in FIG. 16 and represented by the closed data points (values are in Table 4) are the calculated SWNT fractions for both laser and arc sample sets using the current reference ratios (0.319 for purified laser and 0.253 for purified arc) as a function of the constructed SWNT mass fraction, $^{c}w_{SWNTs}$. It is apparent from the experimental results for two different SWNT chirality distributions, that the reported method overestimates the actual SWNT fraction.

TABLE 4

Purity Assessment Results for the Constructed SWNT Sample Sets Based
on the Nonlinear Lorentzian Estimation of the π-Plasmon for SWNTs
in a 2.5 μg/mL DMA Dispersion As Compared to the Areal Absorbance
Method from the Literature and the Modified Linear Subtraction[a]

| Designed Fraction $^C W_{SWNTs}$ | Itkis et al. | | Modified Linear $^S E_{22}$ | | Modified Linear $^M E_{11}$ | | π-Sub.$^S E_{22}$ | | π-Sub.$^M E_{11}$ | |
|---|---|---|---|---|---|---|---|---|---|---|
| 100% Laser | Ref. = 0.319[a] | | Ref. = 0.0143[a] | | Ref. = 0.00615[b] | | 101 | (1) | 103 | (3) |
| 80% Laser | 86 | (8) | 79 | (1) | 81 | (1) | 80 | 80% Laser | 86 | (8) |
| 60% Laser | 70 | (17) | 58 | (3) | 61 | (2) | 59 | 60% Laser | 70 | (17) |
| 40% Laser | 53 | (33) | 39 | (3) | 43 | (8) | 39 | 40% Laser | 53 | (33) |
| 20% Laser | 28 | (40) | 18 | (10) | 24 | (20) | 20 | 20% Laser | 28 | (40) |
| Avg. % Dev. (Avg. Rel. % Error) | 9 | (24) | 2 | (4) | 2 | (8) | 1 | (1) | 2 | (3) |
| 100% Arc | Ref. = 0.253[c] | | Ref. = 0.00974[c] | | Ref. = 0.00370[d] | | 104 | (4) | 106 | (6) |
| 80% Arc | 96 | (20) | 81 | (1) | 84 | (5) | 78 | 80% Arc | 96 | (20) |
| 60% Arc | 84 | (40) | 61 | (2) | 63 | (5) | 59 | 60% Arc | 84 | (40) |
| 40% Arc | 61 | (53) | 38 | (5) | 50 | (25) | 35 | 40% Arc | 61 | (53) |
| 20% Arc | 45 | (125) | 24 | (20) | 30 | (50) | 22 | 20% Arc | 45 | (125) |
| Avg. % Dev. (Avg. Rel. % Error) | 22 | (59) | 2 | (7) | 7 | (21) | 3 | (6) | 4 | (7) |
| Raw Laser | 31 | | 22 | | 28 | | 24 | | 30 | |
| Raw Arc | 31 | | 22 | | 22 | | 19 | | 26 | |

[a] Integration limits = 0.97-1.53 eV,
[b] Integration limits = 1.53-2.08 eV,
[c] Integration limits = 0.94-1.47 eV,
[d] Integration limits = 1.47-2.00 eV Using a modified linear peak ratio, it is possible to estimate the relative purity of SWNTs at equal solvent dispersion concentrations. The modified linear ratio calculation involves dividing the area of the peak region above the linear fit for an unknown SWNT sample [$^{(P,X)}AA(^S E_{22})$] by the established reference value for a pure sample [$^{(P,R)}AA(^S E_{22})$]. Since the constructed samples are at equal concentrations, 2.5 μg/mL, the modified linear ratio can be applied and the results are represented by the open data points (values are in Table 4) of FIG. 16. The reference values for the modified linear peak areas of the purified laser and purified arc SWNT samples are shown in Table 4 as the "100%" samples. The average percent deviation is <7% in all cases, but the average percent error increases significantly with lower SWNT designed fractions. Since selection of the spectral cutoffs for integration is based on the SWNT reference sample, the limitations associated with any linear approach are problematic, including overlap of electronic transitions and peak minima shifting from absorption of impurities in the unknown SWNT samples. Such effects are proposed to account for the higher average percent errors in the calculation at low SWNT concentrations. For a more accurate SWNT purity assessment, knowledge of the underlying contributions from the electronic transitions and π-plasmons of all constituents (i.e., SWNTs and carbonaceous impurities) is warranted. In addition, the development of a rapid assessment protocol which is concentration independent is also desirable, since the modified linear approach requires equal dispersion concentrations for proper analysis.

Example 13

Nonlinear Subtraction Approach

In a given SWNT-containing sample, the total absorption at a selected energy will be a superposition of intensities from interband electronic transitions and the π-plasmon for each carbonaceous constituent. If the total π-plasmon contribution can be subtracted from the optical absorption spectrum, the resulting data will reflect only the interband electronic transitions of the SWNT materials. Therefore, appropriate modeling of the π-plasmon background and the subsequent data subtraction, will enable the development of calibration curves that directly relate to the relative concentrations of each carbonaceous component. Based on these calibration curves, it is expected that a simple relationship for measuring the SWNT purity can be obtained. In comparison to a linear subtraction approach, the nonlinear function would account for physical properties in the SWNT absorption spectrum like peak overlap and transition broadening, which cannot be adequately accounted for by selection of integration limits at neighboring peak minima.

Although the underlying π-plasmon over the SWNT absorption range has been previously approximated by a linear relationship (Itkis et al., *Nano Lett.* 3:309 (2003); Hu et al., *J. Phys. Chem. B* 107:13838 (2003); Itkis et al., *J. Phys. Chem. B* 108:12770 (2004); Sen et al., *Chem. Mater.* 15:4273 (2003); Zhao et al., *J. Phys. Chem. B* 108:8136 (2004), which are hereby incorporated by reference in their entireties), various theoretical and experimental reports have investigated the nonlinear functional dependence of this transition (Stockli et al., *Phys. Rev. B* 64:115424 (2001); Shyu et al., *Phys. Rev. B* 62:8508 (2000); Shyu et al., *Phys. Rev. B* 60:14434 (1999); Lin et al., *Phys. Rev. B* 62:13153 (2000); Lin et al., *Phys. Rev. B* 53:15493 (1996); Lin et al., *Phys. Rev. B* 50:17744 (1994); Jiang et al., *Phys. Rev. B* 54:13487 (1996); Lauret et al., *Phys. Rev. Lett.* 90:57404 (2003); Bose et al., *Phys. Lett. A* 289:255 (2001); Pichler et al., *Phys. Rev. Lett.* 80:4729 (1998), which are hereby incorporated by reference in their entirety). The π-plasmon is the collective excitations of the electrons associated with the π-band in a sample (Pichler et al., *Phys. Rev. Lett.* 80:4729 (1998), which is hereby incorporated by reference in its entirety). The peak maximum of the dispersion relation, which corresponds to the π-plasmon resonance energy ($\omega_\pi$ for h=1), are generally reported in the range of ~4.5-7 eV. The use of a Lorentzian function to model a wide variety of physical observables involving resonance behavior is well established (Dresselhaus et al., *Science of Fullerenes and Carbon Nanotubes*; Academic Press: San Diego, Calif., 1996); Lauret et al., *Phys. Rev. Lett.* 90:57404 (2003), which are hereby incorporated by reference in their entirety). Furthermore, surface plasmons can be modeled by a driven damped harmonic oscillator, whose solution is indeed a Lorentzian in the underdamped regime (Jackson, *Plane Electromagnetic Waves and Wave Propagation*. In "Classical Electrodynamics," $2^{nd}$ ed.; John Wiley & Sons: New York, 1962, p 284, which is hereby incorporated by reference in its entirety). Therefore, a Lorentzian function has been selected to model the carbonaceous π-plasmon in the following form:

$$L(x) = \frac{a}{1+\left(\frac{x-b}{c}\right)^2}$$

where a is the peak amplitude, b equals the peak energy, and c is a measure of the peak width. Analyses were performed using the Kaleidagraph software package.

Example 14

Lorentzian Curve Fitting Results

Figure 17:
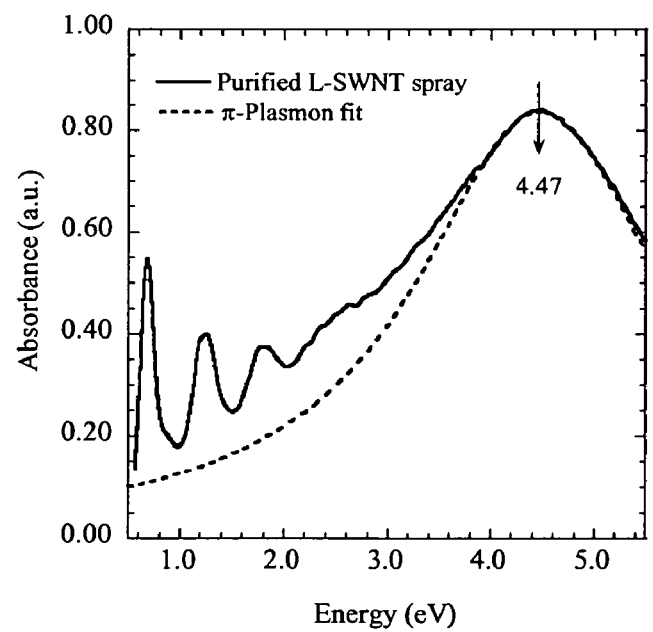
FIG. 17 is an optical absorption spectra of purified L-SWNTs sprayed onto a quartz slide from a 0.1 mg/mL acetone solution with the corresponding nonlinear π-plasmon curve fit shown by the dashed line. The Lorentzian curve fit from the data between 4.0-5.0 eV shows a strong correlation to the peak region of the data, and the peak maxima denoting the π-plasmon energy is calculated to be 4.47 eV.
Figure 18:
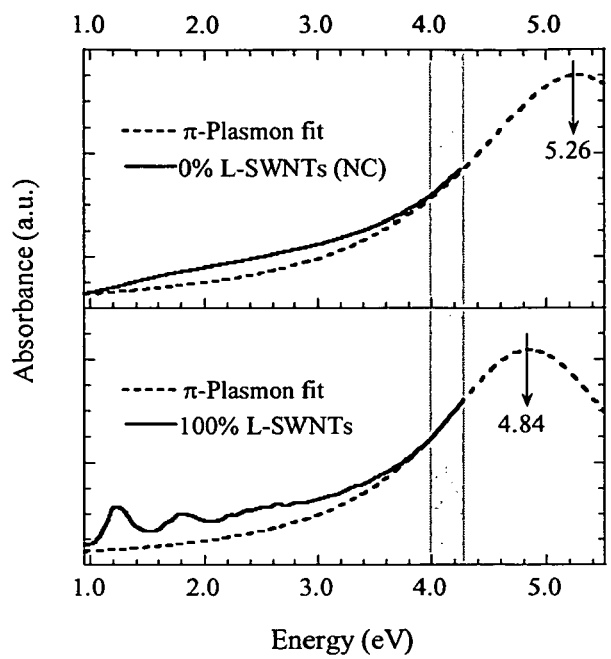
FIG. 18 is an optical absorption spectra of 2.5 μg/mL DMA dispersions of 0% L-SWNTs (NC) and 100% L-SWNTs with the corresponding nonlinear π-plasmon curve fits shown by dashed lines. The peak maxima denoting the π-plasmon energy is calculated to be 4.84 eV for the 100% L-SWNTs and 5.26 eV for the 0% L-SWNTs (NC). The gray band depicts the data region from which the nonlinear π-plasmon curve fit was generated.
Figure 19:
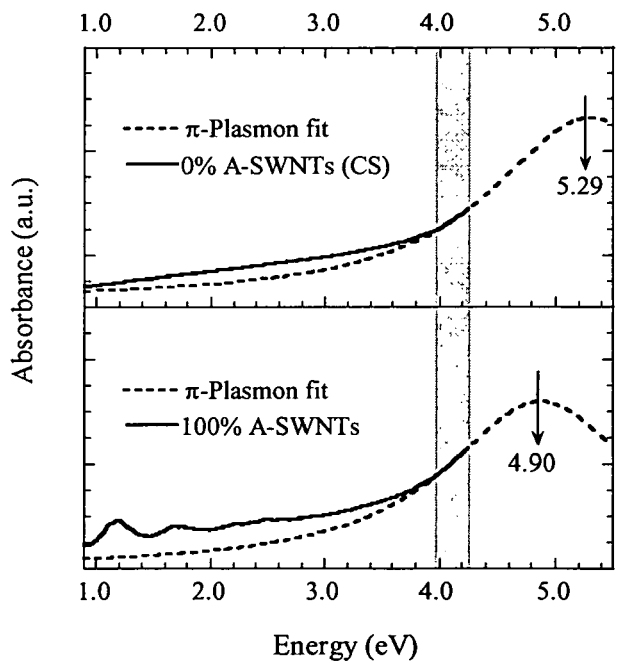
FIG. 19 is an optical absorption spectra of 2.5 μg/mL DMA dispersions of 0% A-SWNTs (CS) and 100% A-SWNTs with the corresponding nonlinear π-plasmon curve fits shown by dashed lines. The peak maxima denoting the π-plasmon energy is calculated to be 4.90 eV for the 100% A-SWNTs and 5.29 eV for the 0% A-SWNTs (CS). The gray band depicts the data region from which the nonlinear π-plasmon curve fit was generated.

In the case of the constructed sample sets, the position of the π-plasmon peak is outside the solvent transmission window for DMA. Therefore, validation of the Lorentzian functional form's efficacy in fitting the π-plasmon peak, was initially made by applying the above equation to an acetone sprayed sample of purified SWNTs where the peak is observable. FIG. 17 shows the Lorentzian curve fit to the optical transmission data in the peak region of 4.0-5.0 eV, for the purified L-SWNT sample. The observed correlation between the curve fit and data substantiates the selection of a Lorentzian for modeling of the π-plasmon. However, it is inappropriate to use the calculated curve fitting parameters from this fit, including the peak value of ~4.5 eV, in other non-acetone sprayed samples, especially for the SWNT-DMA dispersions. This assertion is based on major differences in experimental acquisition conditions. The effects of SWNT bundling, solvent interactions during dispersion, or thin film particle scattering in the sprayed sample, are several examples of these differences. Instead, the Lorentzian curve fits for the constructed sample sets were generated from the optical absorption data between 4.00-4.25 eV, where the π-plasmon absorption is proposed to be dominant in comparison to the electronic transitions of the carbonaceous materials. The resulting curve fits are shown for the DMA dispersions containing purified L-SWNT, π-SWNT, nanostructured carbon, and carbon soot in FIGS. 18 and 19. The Lorentzian curve fits for the purified SWNTs are expected to represent the superposition of π-plasmon contributions from the entire distribution of SWNT diameters and electronic types present in each sample. Similarly, the Lorentzian curve fits for nanostructured carbon and carbon soot are a superposition of the π-plasmon contributions from the various carbonaceous components, including the overall morphology and particle sizes in each sample. There is a strong correlation between the optical absorption data and chosen Lorentzian functional form. Sensitivity of this approach to the range of data for curve fitting was also investigated, but the most reasonable agreement with the spectral features of the SWNTs was observed for the prescribed data range. Slight variations in the fitting region (e.g. 3.75-4.00 eV and 3.75-4.25 eV) resulted in little or no change in the low energy range (~1-2 eV) where the purity assessment is performed. The value of the Lorentzian curve fits at 1.5 eV showed a deviation of less than 5% for the data ranges examined. Therefore, the Lorentzian function was deemed an appropriate approximation to the π-plasmon for the constructed sample sets.

The Lorentzian curve fits determined the π-plasmon resonance energy to be at 4.84 eV for the purified L-SWNTs and 4.90 eV for the purified A-SWNTs. As expected, the location of the π-plasmon peak positions have shifted between sprayed solid sample and solvent dispersion due to the differences in experimental conditions. However, the measured and projected values are consistent with experimental reports using optical absorption spectroscopy of evaporated SWNTs where the peak was stated to be "around 5 eV."

The curve fits for the π-plasmons of nanostructured carbon ($\omega_\pi$=5.26 eV) and carbon soot ($\omega_\pi$=5.29 eV) show a general trend whereby the resonance energy is higher than for the purified SWNTs in the DMA dispersions. This would be consistent with a lowering of the energy required for the collective π-π* transitions in SWNTs since the highly-conjugated π-system leads to delocalization of the electrons. The absorption of $C_{60}$ fullerenes which occurs at 3.7 eV is below the employed curve fit range, but may influence the curve fitting approach if significant quantities are present. Since in both nanostructured carbon and carbon soot the presence of $C_{60}$ was low (~3% w/w), consistent with the lack of any spectral signature, the contribution to the curve fit is considered negligible.

Figure 20:
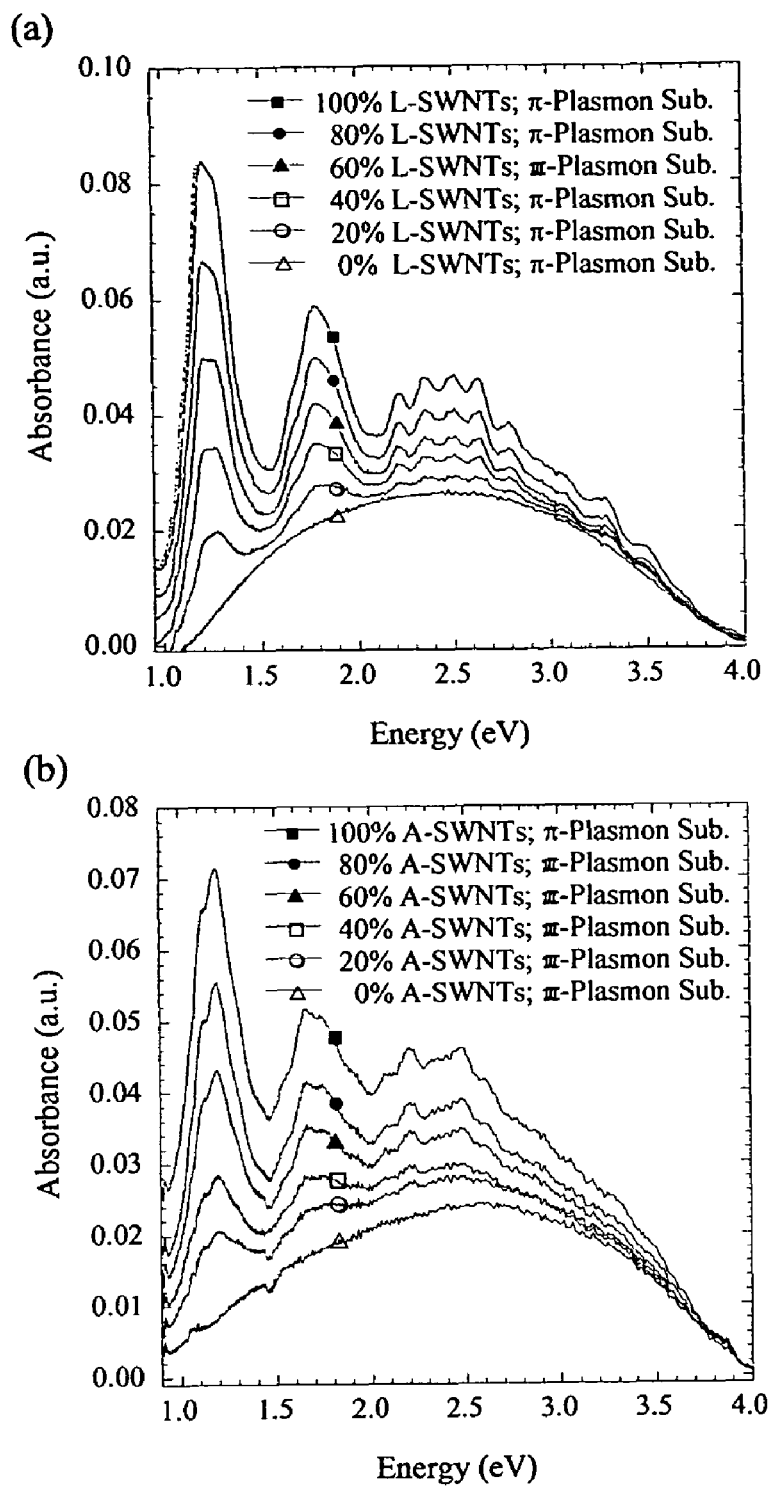
FIGS. 20a-b are optical absorption spectral overlays for nonlinear π-plasmon subtractions of the constructed sample sets for L-SWNTs (FIG. 20a) and A-SWNTs (FIG. 20b).

In the constructed sample sets, the Lorentzian curve fits are a superposition of all the π-plasmon contributions present in the sample, including both SWNT and carbonaceous impurity distributions. The resulting nonlinear π-plasmon functions showed similar curve fitting parameters for both laser and arc constructed sample sets. The resulting optical absorption spectra, after subtraction of the nonlinear π-plasmon functions, are shown in FIGS. 20a-b for both constructed sample sets. It is important to note that any effects due to particle scattering in the DMA dispersions, which have previously been reported as negligible for DMF and aqueous dispersions at higher concentrations, may be used as a further refinement to the ascribed nonlinear subtraction. The data indicates a broad absorption over the energy range for both nanostructured carbon and carbon soot materials which are attributed to the electronic transitions of the constituent carbonaceous materials (such as fullerenes, amorphous carbon, and other graphitic components). The purified L-SWNTs and A-SWNTs display well resolved peak structures, particularly in the region above 2 eV, representative of the electronic transitions for each diameter and electronic type. Such spectra are expected to enable the appropriate deconvolution of absorption data based the predicted energy gap transitions for individual SWNT diameters. This type of analysis will allow for the calculation of the semiconducting:metallic ratio (S:M) for any SWNT diameter distribution and serve as a means for accurate assessment of electronic type separations (Samsonidze et al., *Appl. Phys. Lett.* 85:1006 (2004), which is hereby incorporated by reference in its entirety).

An observed result from the nonlinear curve fits is that the minima between peaks ($^SE_{22}$ and $^ME_{11}$ for example) do not equal zero. This result is consistent with the expectation that an optical absorption spectrum of SWNTs exhibits an overlap of electronic transitions and peak broadening for individual transitions. Such physical properties are not accounted for in a linear subtraction model, and are important factors in determining an appropriate $\pi$-plasmon subtraction. Overlap of electronic transitions may exist due to variation in the density of states for the collection of diameters and chiralities involved with the optical absorption. Therefore, with the typical diameter distribution ranging from 1.2-1.5 nm for laser (1.3-1.6 nm for arc), the possibility exists that an optical absorption peak from a smaller diameter semiconducting SWNT could overlap with a larger diameter metallic SWNT. In addition, peak broadening in the case of SWNTs could be influenced by structural distortions and defects, finite SWNT lengths, or bundling effects arising from the van der Waals interactions between SWNTs.

Example 15

Calibration Curves for Purity Assessment

Figure 21:
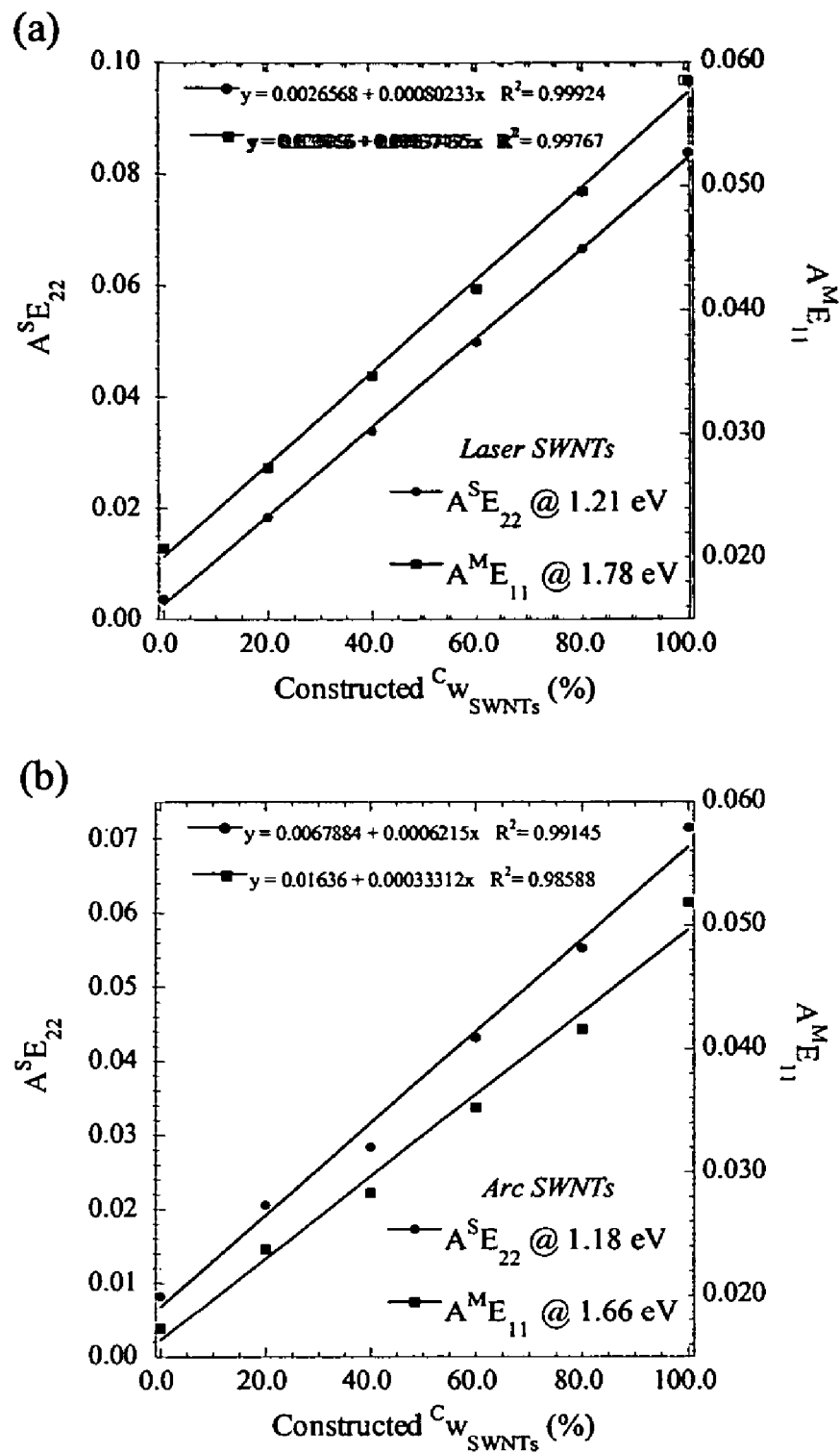
FIGS. 21a-b are calibration curves for purity assessment from the nonlinear π-plasmon subtracted constructed sample sets for L-SWNTs (FIG. 21a) and A-SWNTs (FIG. 21b). The data was selected from the peak energy values in FIGS. 20a-b associated with the maximum absorbance at $^SE_{22}$ and $^ME_{11}$ for each constructed fraction.

Each of the designed fractions in FIGS. 20*a-b* coincides with the appropriate superposition of absorbance expected from the constructed dilutions between nanostructured carbon and L-SWNTs (A-SWNTs). Therefore, it is possible to establish calibration curves for both laser and arc SWNTs utilizing the constructed sample sets. FIGS. 21*a-b* demonstrate the linear relationships that result from selection of the absorbance values at the peak maxima for the semiconducting ($A^SE_{22}$) and metallic ($A^ME_{11}$) transitions in both constructed sample sets. The anticipated correlation between the data and the linear curve fit is clearly observed. The calibration lines are unique to the SWNT constructed sample sets from FIGS. 20*a-b* and therefore cannot be used as an absolute metric for material comparison with any SWNT sample or diameter distribution. Development of such calibration curves is also relative to the initial choice of carbon impurity used to fabricate the constructed sample sets (nanostructured carbon for laser and carbon soot for arc). The results, however, clearly demonstrate the methodology for SWNT purity assessment of typical laser and arc-synthesized materials.

There are important considerations related to the choice of analysis used to generate the calibration curves (i.e., peak maxima versus integrated peak area). In the present case, the use of peak maxima values has important advantages over integrated area based on the observed SWNT distribution. For the laser and arc $^SE_{22}$ and $^ME_{11}$ peaks in FIGS. 20*a-b*, the superposition of interband electronic transitions based on the samples' diameter ranges give rise to a peaked distribution with the amplitude proportional to the area with minimal effects of peak overlap (as described above) and appropriate selection of integration limits. The degree of overlap is largely influenced by the type of SWNT distribution being evaluated, since the density of interband electronic transitions over a particular energy range dictates this overlap as visualized from a Kataura plot. In samples where the interband peaks result in multi-modal structures and selection of integration limits is less problematic, the integrated area approach may prove worthwhile.

Application of the calculated linear trendlines in FIGS. 21*a-b* is specific to 2.5 µg/mL DMA dispersion, but this approach is valid for any concentration below the dispersion limit. The purity assessment results as seen in Table 4 are dramatically improved compared to the reported areal absorbance ratio method and consistently show better correlation with the lower designed SWNT mass fractions than the modified linear subtraction. The calculated fractions using the nonlinear $\pi$-plasmon subtraction are within an average deviation of the designed values by 1-2% for the L-SWNTs and 3-4% for the A-SWNTs. In comparison, the modified linear subtraction has slightly higher deviation of 2-7% depending on the SWNT sample and selected peak. Another consideration is the accuracy of the calculated value to the designed value, represented by the average relative percent error shown in parentheses in Table 4. For the nonlinear $\pi$-plasmon subtracted approach, the L-SWNTs exhibit an average relative error within 3% of any designed fraction and the A-SWNTs are within 7% for either peak. The modified linear subtraction shows relatively good agreement for the $^SE_{22}$ peaks in the laser and arc sample sets, but shows significantly higher average relative errors from the $^ME_{11}$ peak.

Figure 22:
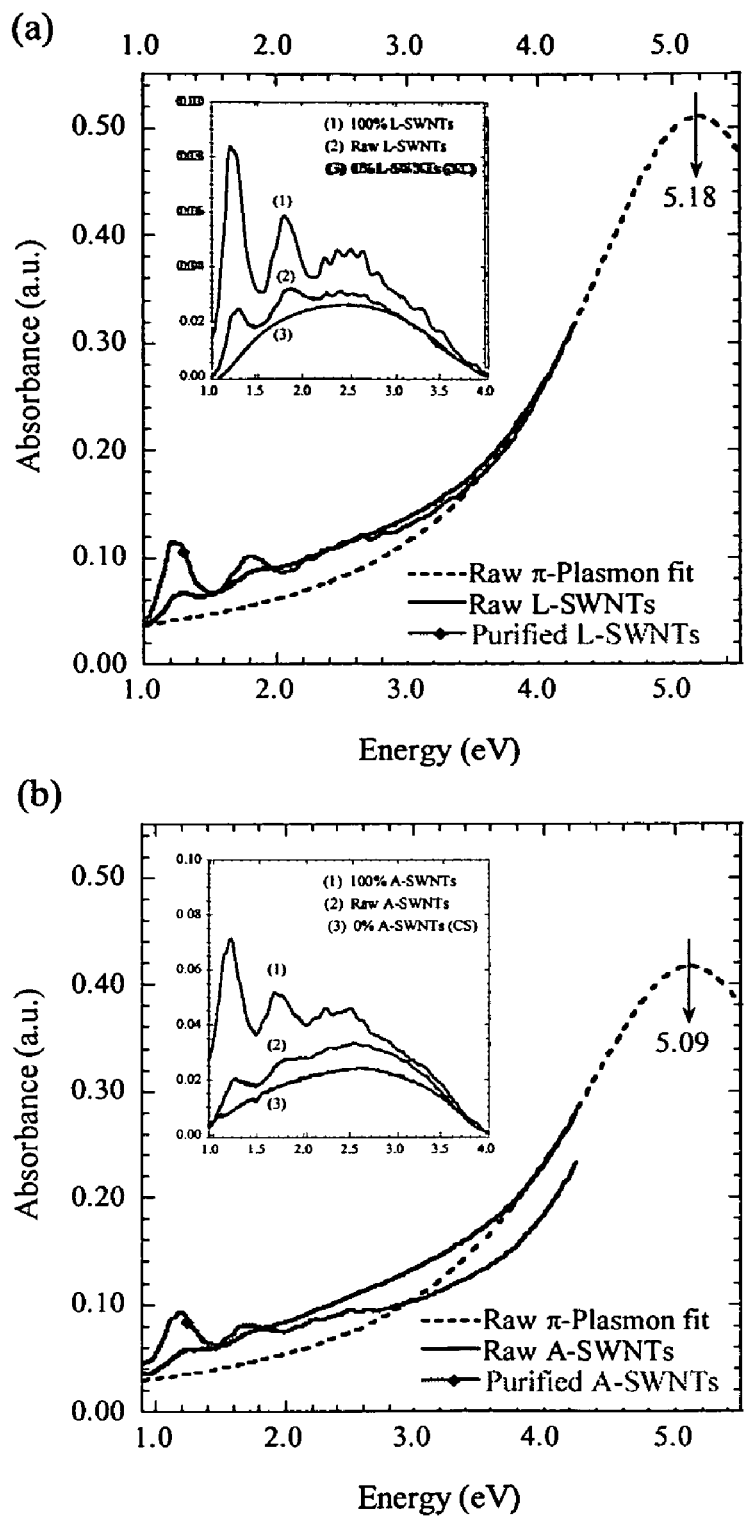
FIGS. 22a-b are optical absorption spectra of 2.5 μg/mL DMA dispersions for raw L-SWNTs (FIG. 22a) and raw A-SWNTs (FIG. 22b) (as purchased from Carbon Solutions, Inc.). The corresponding nonlinear π-plasmon fits for the raw SWNTs are represented by the dashed lines. The spectra for purified SWNTs from each synthetic type are also overlaid for reference. The insets compare the π-plasmon subtracted results for each raw SWNT soot against the 0% and 100% SWNT samples for each synthetic type.

Modifications in the SWNT diameter distributions and (S:M) may alter the empirical calibration curves, but the nonlinear curve fitting approach has demonstrated success for both laser and arc SWNTs. The natural extension of these results from the constructed sample sets is to evaluate raw laser and arc SWNT soots with the established nonlinear $\pi$-plasmon fit and calibration curves. Shown in FIGS. 22*a-b* are the optical absorption spectra for 2.5 µg/mL DMA dispersions of raw L- and A-SWNT soots, including the corresponding Lorentzian curve fits for the raw soots. The $\pi$-plasmon subtracted data are depicted in the insets for both L-SWNT and A-SWNT soots with the corresponding "0%" and "100%" SWNT subtracted spectra also shown as a reference for comparison. In the acquired data, there is a slight increase in the absorption of the raw laser soot as compared to the purified spectra between ~2-3 eV evident by the offset in the overlay. This increase in absorption is proposed to result from the carbonaceous coatings that are produced during synthesis and are removed during the high temperature oxidation treatments in the purification. It is expected that the carbonaceous coatings will have an effect on the observed $\pi$-plasmon energy, and indeed there are differences between the raw SWNT soots and the expected values from the constructed sample sets. The offset is more dramatic in the case of the raw arc soot, thereby suggesting that the degree of carbonaceous coatings would be higher. However, the raw arc soot may have originally contained graphitic material. The possibility then exists that the purified A-SWNTs has retained this graphitic constituent since the purification process may not be efficient at its removal. The effects of $C_{60}$ and other fullerenes can also impact the optical absorption data of raw SWNT soot, but current results from a toluene extraction of the raw laser and raw arc materials show only trace quantities (<1% w/w). Therefore, the higher absorption in this range is likely a combination of effects in the raw soots, but does not significantly impact purity assessment through analysis of the $^SE_{22}$ peak. The data indicates that the $^SE_{22}$ peak is most accurate due to confounding effects of carbonaceous coatings from synthesis. The results using the calibration curves for the $^SE_{22}$ peak in FIGS. 21*a-b* on the $\pi$-plasmon subtracted raw SWNT soot data are shown in Table 4. The raw L-SWNT soot and A-SWNT soot were calculated to equal 24% and 19% w/w SWNTs of the total carbonaceous material, respectively. As expected, these values are substantially lower than the calculated 31% for both laser and arc based on the areal absorbance ratio method using the current reference ratios (0.319 for purified laser and 0.253 for purified arc). However, the modified linear subtraction is relatively consistent with the π-plasmon subtracted results indicating a value of 22% w/w for each raw SWNT soot. When the TGA data (raw L-SWNT soot residue=10.2% and raw A-SWNT soot residue=31.9% w/w) is accounted for, the resulting total mass fraction from the π-plasmon subtraction results is 22% w/w for raw laser and 13% w/w for raw arc. These values are strikingly lower than previous reports, but are consistent with the microscopic analysis in FIG. 4.

Example 16

Rapid Purity Assessment Protocols

Figure 23:
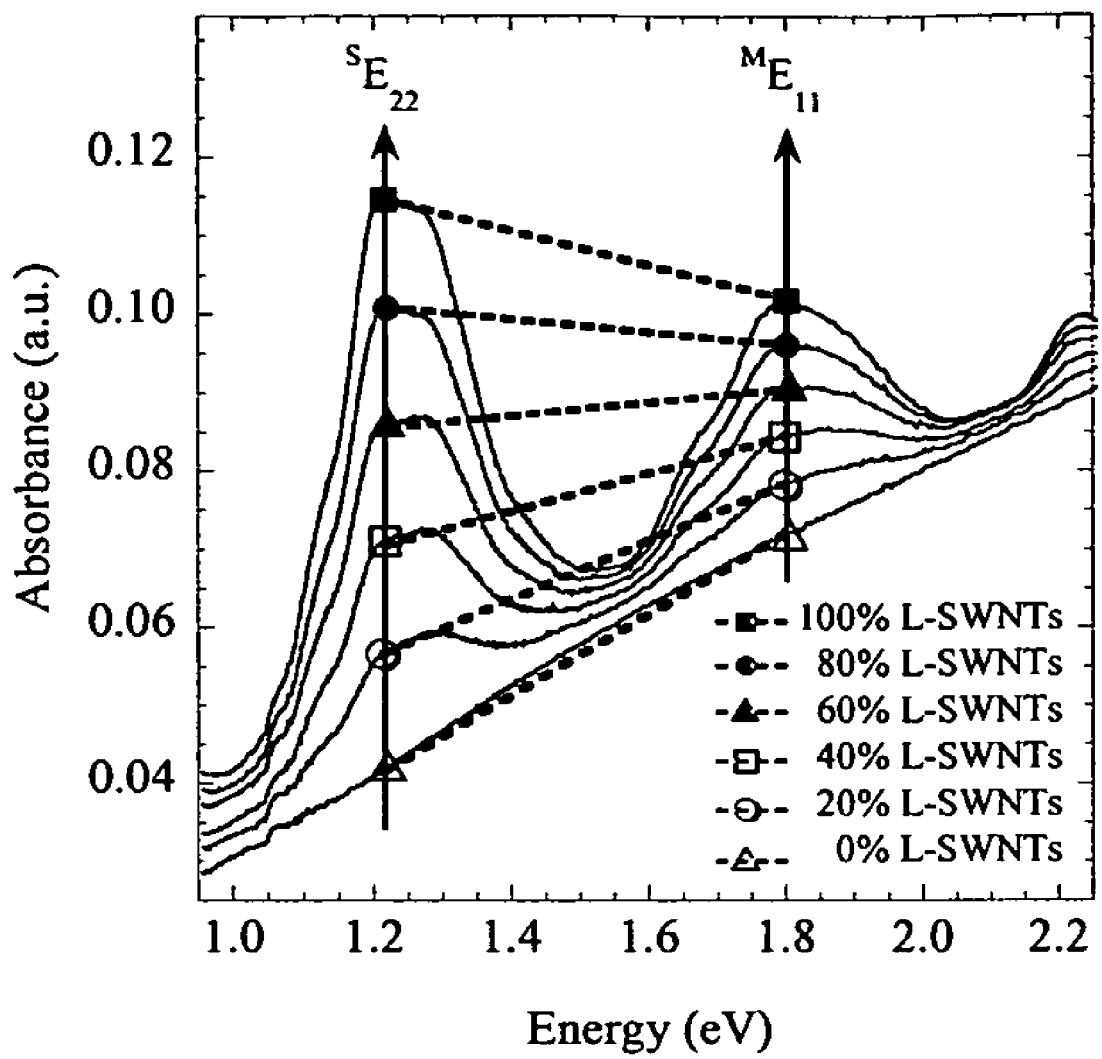
FIG. 23 is an optical absorption spectra from FIG. 14a for the constructed L-SWNT sample set where the peak maxima for the $^SE_{22}$ and $^ME_{11}$ transitions are highlighted with the symbols. The dashed tie line which is drawn between the peak maxima indicates the relative changes in slope of this line between peaks for each SWNT fraction.

While the nonlinear π-plasmon model has been demonstrated as a physically robust approach, the generation and implementation of calibration curves are not time efficient for large numbers of samples and do not allow for critical evaluation of results in presentations or publications without access to the actual data. Therefore, it is also desirable to establish rapid assessment protocols which facilitate SWNT sample screening during synthesis, purity monitoring during purification procedures, and enable the estimation of purity from visual observation during presentations or in publications. Based on the constructed sample sets, there are several important observations which can be incorporated into purity assessment protocols. As shown in FIG. 23, the absolute intensity and ratio of intensities of the $^SE_{22}$ peak and $^ME_{11}$ peak for the L-SWNT constructed sample set (as well as for the A-SWNT constructed sample set) varies consistently with the relative weight fraction of SWNTs present. Further visualization can be made by drawing tie lines from peak maxima and observing the changes in slope of the line as a function of weight fraction. Therefore, such observations present alternative strategies for SWNT purity assessment.

Both laser and arc constructed sample sets were evaluated based on a summation of the absorbance values for the $^SE_{22}$ and $^ME_{11}$ peaks as a function of the designed SWNT fraction. The results are shown in FIG. 24a and illustrate the linear relationship for both cases which are normalized to dispersion concentration (i.e., absorbance values were divided by the dispersion concentration of 2.5 µg/mL). The offset in y-intercepts are attributed to the differences in the maximum absorption which can result from different extinction coefficients (SWNT or selected carbon impurities), SWNT molecular weights, or purity between purified L- and A-SWNTs. (Such an offset in the absorption for purified A-SWNTs can be related to any residual graphite in the sample, thereby altering the DMA dispersion concentration during analysis.) Evaluation of the slope for peak maxima tie lines also results in a linear trendline as depicted in FIG. 24b. The data are also normalized to dispersion concentration and show a convergence of maximum negative slope (approaching −0.012) for the "100%" sample in both laser and arc constructed sample sets. For peak maxima tie lines of zero slope, the purity is approximately 70% w/w SWNTs in the carbonaceous component. This result implies that positive tie line slopes will occur for samples of less than 70% w/w SWNTs and negative slopes exist for samples of greater purity. Comparison of the peak maxima summation or tie line slope for a sample with unknown SWNT purity to the empirical relations (normalized to the dispersion concentration of 1 µg/mL) in FIGS. 24a-b will allow for the rapid determination of its carbonaceous purity.

The $^SE_{22}$ peak was previously shown to be least affected by the absorption from the carbon impurities in a sample (FIGS. 20a-b), and from the carbonaceous coatings (FIGS. 22a-b). Therefore, the use of this peak for a rapid assessment method is plausible and simple. Shown in FIG. 25a are the data for the absorbance value of the $^SE_{22}$ peak for both L-SWNT and A-SWNT constructed sample sets normalized to dispersion concentration. The resulting linearity represents a simple and straightforward method to rapidly assess SWNT purity. A linear dependence is also observed when the ratios of peak maximum absorbance values were plotted as shown in FIG. 25b. Both constructed sets of purified SWNT samples exhibit a peak maxima ratio approaching 1.2 in the plot. A similar observation to the slope approach is that for a ratio ($A^SE_{22}/A^ME_{11}$) of 1.0 (corresponding to a zero tie line slope), the purity of a given sample is approximately 70% w/w SWNTs in the carbonaceous component. Therefore, the same notion exists where peak maxima ratios greater than 1.0 will occur for samples greater than 70% w/w SWNTs and ratios lower than 1.0 exist for purity levels less than 70% w/w SWNTs. In comparison to the other rapid assessment methods, the peak maxima ratio is extremely attractive since it is independent of the dispersion concentration (i.e., the concentration terms cancel upon division), provided the dispersion being analyzed is below the SWNT-solvent dispersion limit. The ratio of peak absorbances can result in an important derivation whereby convolution of the purity with the (S:M) and ratio of extinction coefficients also occurs:

$$\frac{A(^SE_{22}) \equiv \varepsilon_S * l * c_S}{A(^ME_{11}) \equiv \varepsilon_M * l * c_M} = \left(\frac{\varepsilon_S}{\varepsilon_M}\right) * \left(\frac{\zeta}{1-\zeta}\right)$$

where $c_S=\zeta*c_T$ and $c_M=(1-\zeta)*c_T$. This equation represents the ratio of peak maxima for a pure SWNT sample given the fact that there is no concentration term for the impurities. The variables $\varepsilon_S$ and $\varepsilon_M$ are the extinction coefficients for semiconducting and metallic SWNTs, respectively, l is the optical pathlength, $c_S$ is the concentration of semiconducting, $c_M$ is the concentration of metallic SWNTs, $c_T$ is the total SWNT concentration, and $\zeta$ is the fraction of the total SWNT concentration that is semiconducting. As a result, the derivation shows that (S:M) is equal to $\zeta/(1-\zeta)$.

If the (S:M) is assumed to remain constant (typically reported at 2:1), then appropriate use of extinction coefficients in a Beer's Law analysis yields another method for purity assessment. While overlap of SWNT electronic transitions can influence an experimentally calculated $\varepsilon$, the value derived from selecting the peak maximum will be the least sensitive to this effect. As described in the examples above, previous work has determined the value of the extinction coefficients for nanostructured carbon, raw, and purified L-SWNT-DMA dispersions. A similar analysis has been made using carbon soot and purified A-SWNTs for comparison with the laser data. Shown in Table 5 are the calculated extinction coefficients derived from a Beer's Law analysis involving serial dilution of the 2.5 µg/mL DMA dispersions for each material with pure DMA. These results are consistent with the previous values. Since the mass used to calculate the dispersion concentrations for the Beer's Law analysis was for the total concentration of purified SWNTs, $c_T$, the magnitude of the extinction coefficient values are a convolution of the extinction properties for the inherent (S:M). Therefore, as long as the SWNT samples being analyzed have a similar (S:M), incorporation of these constants into the equation below will result in a relative determination of the carbonaceous concentration ratio between the total bulk SWNTs ($c_T$) and carbonaceous impurities ($c_{CI}$):

$$\frac{c_T}{c_{CI}} = \frac{\left(A_{M_{E_{11}}} \cdot \varepsilon_{CI_{S_{E_{22}}}} - A_{S_{E_{22}}} \cdot \varepsilon_{CI_{M_{E_{11}}}}\right)}{\left(A_{S_{E_{22}}} \cdot \varepsilon_{M_{E_{11}}} - A_{M_{E_{11}}} \cdot \varepsilon_{S_{E_{22}}}\right)}$$

where $$c_{w_{SWNTs}} = \frac{\left(\frac{c_T}{c_{CI}}\right)}{\left(1 + \frac{c_T}{c_{CI}}\right)}.$$

TABLE 5

Calculated Extinction Coefficients of SWNTs, Nanostructured Carbon, and Carbon Soot in DMA Dispersions at Selected Energies for Beer's Law Analysis

| solute | $\varepsilon\,(^S E_{22})$ (mL · mg$^{-1}$ · cm$^{-1}$) | $\varepsilon\,(^M E_{11})$ (mL · mg$^{-1}$ · cm$^{-1}$) |
|---|---|---|
| Carbon Soot (Aldrich) | 10.5 (1.18 eV) | 16.5 (1.65 eV) |
| Nanostructured Carbon | 15.5 (1.21 eV) | 26.8 (1.78 eV) |
| Purified A-SWNTs | 35.0 (1.18 eV) | 30.0 (1.65 eV) |
| Purified L-SWNTs | 45.5 (1.21 eV) | 40.0 (1.78 eV) |

Extinction coefficients for SWNTs have been reported in the literature, but an uncertainty exists in regard to what these values represent. Disparities in the value of the dispersion limit for the various species present in a SWNT-containing sample (i.e., SWNTs, graphitic carbon, amorphous carbon, and/or fullerenes) call into question what material is the major contributing factor to the measured extinction coefficients. For unambiguous interpretation of any extinction coefficient data, it is imperative that measurements be performed below the dispersion limit of purified SWNTs in the solvent (e.g. ~3 µg/mL for a DMA dispersion).

The results from each of the rapid techniques on the constructed sample sets are listed in Table 6. Also included are the rapid assessment results on the 2.5 µg/mL raw laser and arc SWNT-DMA dispersions. The proposed effects of carbonaceous coatings are most apparent in the peak summation approach for both raw samples. However, the results for raw laser SWNTs are consistent across each of the techniques with only a minor depression in values compared to the nonlinear π-plasmon model. In contrast, the raw arc SWNT soot shows significantly more variability in each of the rapid assessment analyses, specifically with the slope approach where the measured value is outside the calculated calibration range. As suggested earlier, this variability is attributed to the presence of increased carbonaceous coatings or graphitic components in the arc sample that artificially inflate the absorption in the $^M E_{11}$ peak range, thereby altering the purity assessment results. While the peak summation and tie line slope approach are useful techniques, they are also dispersion concentration dependent. In comparison, the peak maxima ratio ($A^S E_{22}/A^M E_{11}$) and Beer's Law strategies are concentration independent, provided the SWNT-organic solvent dispersion is below the dispersion limit (~3 µg/mL for purified SWNTs). With these observations in mind, the recommended rapid approach to purity assessment includes the following simple procedure: (1) perform TGA analysis of SWNT sample; (2) use corrected carbonaceous mass from TGA residue to prepare and analyze a 2.5 µg/mL SWNT-DMA dispersion from 0.90-4.25 eV using optical absorption spectroscopy; (3) evaluate the absorbance peak maximum values for the $^S E_{22}$ and $^M E_{11}$ peaks; (4) calculate the peak maximum ratio and compare to the calibration curve or utilize Beer's Law with appropriate extinction coefficients for an assessment of the $^c w_{SWNTs}$ in the carbonaceous component; (5) and adjust for the metal catalyst impurities from the TGA residue to determine the overall $w_{SWNTs}$ in the analyzed sample.

TABLE 6

Purity Assessment Results for the Constructed SWNT Sample Sets Based on the Rapid Protocols[a]

| Designed Fraction $^c W_{SWNTs}$ | $A(^S E_{22}) + A(^M E_{11})$ | | Slope $[(A(^S E_{22}), A(^M E_{11})]$ | | $A(^S E_{22})$ | | $A(^S E_{22})/A(^M E_{11})$ | | Beer's Law | |
|---|---|---|---|---|---|---|---|---|---|---|
| 100% Laser | 99 | (1) | 100 | (0) | 100 | (0) | 96 | (4) | 99 | (1) |
| 80% Laser | 80 | (0) | 80 | (0) | 80 | (0) | 80 | (0) | 79 | (1) |
| 60% Laser | 61 | (2) | 60 | (0) | 60 | (0) | 62 | (3) | 58 | (3) |
| 40% Laser | 40 | (0) | 39 | (3) | 40 | (0) | 40 | (0) | 38 | (5) |
| 20% Laser | 20 | (0) | 20 | (0) | 20 | (0) | 17 | (15) | 20 | (0) |
| Avg. % Dev. (Avg. Rel % Error) | <1 | (1) | <1 | (1) | 0 | (0) | 2 | (5) | 1 | (2) |
| 100% Arc | 103 | (3) | 101 | (1) | 102 | (2) | 97 | (3) | 99 | (1) |
| 80% Arc | 78 | (3) | 80 | (0) | 79 | (1) | 82 | (3) | 80 | (0) |
| 60% Arc | 56 | (7) | 59 | (2) | 58 | (3) | 64 | (7) | 60 | (0) |
| 40% Arc | 39 | (3) | 34 | (15) | 39 | (3) | 37 | (8) | 37 | (8) |
| 20% Arc | 21 | (5) | 21 | (5) | 22 | (10) | 19 | (5) | 24 | (20) |
| Avg. % Dev. (Avg. Rel. % Error) | 2 | (4) | 2 | (5) | 2 | (4) | 3 | (5) | 2 | (6) |
| Raw Laser | 34 | | 17 | | 28 | | 19 | | 20 | |
| Raw Arc | 53 | | — | | 42 | | 9 | | 18 | |

[a]The values in parentheses represent the average relative percent error for a measured fraction, CWSWNTs.

Although preferred embodiments have been depicted and described in detail herein, it will be apparent to those skilled in the relevant art that various modifications, additions, substitutions, and the like can be made without departing from the spirit of the invention and these are therefore considered to be within the scope of the invention as defined in the claims which follow.

What is claimed:

1. A dispersion of nanostructured carbon in an organic solvent, wherein the organic solvent comprises an alkyl amide compound having the structure:

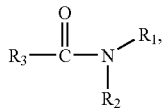

wherein
R$_1$ and R$_2$ are independently selected from the group consisting of H, C$_1$-C$_6$ alkyl, and phenyl, provided that R$_1$ and R$_2$ are not both H, and
R$_3$ is selected from the group consisting of C$_1$-C$_6$ alkyl, phenyl, and

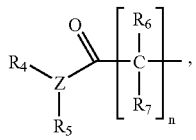

wherein
Z is N or CH;
R$_4$, R$_5$, R$_6$, and R$_7$ are independently selected from the group consisting of H, C$_1$-C$_6$ alkyl, and phenyl; and
n is an integer from 1 to 3.

2. The dispersion according to claim 1, wherein R$_1$, R$_2$, and R$_3$ are independently selected from C$_1$-C$_6$ alkyl and phenyl.

3. The dispersion according to claim 2, wherein the alkyl amide compound is selected from the group consisting of N,N-dimethylacetamide, N,N-dimethylpropanamide, and N,N-diethylacetamide.

4. The dispersion according to claim 3, wherein the alkyl amide compound is N,N-dimethylacetamide.

5. The dispersion according to claim 1, wherein R$_3$ is

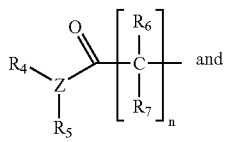

R$_1$, R$_2$, R$_4$, and R$_5$ are independently selected from C$_1$-C$_6$ alkyl and phenyl.

6. The dispersion according to claim 5, wherein
Z is N and
n is 1.

7. The dispersion according to claim 6, wherein the alkyl amide compound is selected from the group consisting of N,N,N',N'-tetramethylmalonamide, N,N'-dibutyl-N,N'-dimethylmalonamide, N,N,N',N'-tetra(isopropyl)malonamide, N,N,N',N'-tetrahexylmalonamide, 2-methyl-N,N,N',N'-tetrahexylmalonamide, and N,N,N',N'-tetrahexyl-2,2-dimethylmalonamide.

8. The dispersion according to claim 7, wherein the alkyl amide compound is N,N,N',N'-tetramethylmalonamide.

9. The dispersion according to claim 5, wherein
Z is CH,
n is 1, and
R$_4$ and R$_5$ are H.

10. The dispersion according to claim 9, wherein the alkyl amide compound is N,N-dimethylacetoacetamide.

11. The dispersion according to claim 5, wherein
Z is N and
n is 2.

12. The dispersion according to claim 11, wherein the alkyl amide compound is N,N,N',N'-tetramethylsuccinamide.

13. The dispersion according to claim 1, wherein the nanostructured carbon is selected from the group consisting of raw nanostructured carbon soot, purified nanostructured carbon, and mixtures thereof.

14. The dispersion according to claim 1, wherein the nanostructured carbon is selected from the group consisting of carbon nanotubes, nano-onions, nano-horns, and fullerenes.

15. The dispersion according to claim 14, wherein the nanostructured carbon comprises carbon nanotubes selected from the group consisting of single wall carbon nanotubes, double wall carbon nanotubes, and multi-wall carbon nanotubes.

16. The dispersion according to claim 15, wherein the nanostructured carbon comprises single wall carbon nanotubes.

17. A method of mobilizing nanostructured carbon, said method comprising:
providing a dispersion of nanostructured carbon according to claim 1 and
applying an electrical field to the dispersion under conditions effective to mobilize the nanostructured carbon.

18. The method according to claim 17, wherein the nanostructured carbon comprises single wall carbon nanotubes.

19. The method according to claim 17 further comprising:
depositing the nanostructured carbon onto a substrate.

20. The method according to claim 19, wherein the substrate is selected from the group consisting of a metal electrode and a doped semiconductor.

21. A method of dispersing nanostructured carbon in an organic solvent, said method comprising:
providing nanostructured carbon and
contacting the nanostructured carbon with an organic solvent comprising an alkyl amide compound having the structure:

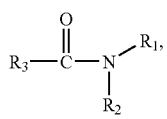

wherein
R$_1$ and R$_2$, are independently selected from the group consisting of H, C$_1$-C$_6$ alkyl, and phenyl, provided that R$_1$ and R$_2$ are not both H, and $R_3$ is selected from the group consisting of H, $C_1$-$C_6$ alkyl, phenyl and

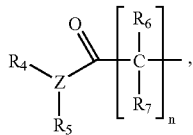

wherein

Z is N or CH;

$R_4$, $R_5$, $R_6$, and $R_7$ are independently selected from the group consisting of H, $C_1$ to $C_6$ alkyl, and phenyl; and n is an integer from 1 to 3 under conditions effective to disperse the nanostructured carbon in the organic solvent.

22. The method according to claim 21, wherein $R_1$, $R_2$, and $R_3$ are independently selected from $C_1$-$C_6$ alkyl and phenyl.

23. The method according to claim 22, wherein the alkyl amide compound is selected from the group consisting of N,N-dimethylacetamide, N,N-dimethylpropanamide, and N,N-diethylacetamide.

24. The method according to claim 23, wherein the alkyl amide compound is N,N-dimethylacetamide.

25. The method according to claim 21, wherein $R_3$ is

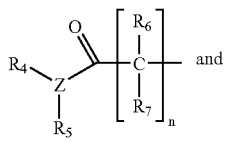

$R_1$, $R_2$, $R_4$, and $R_5$ are independently selected from $C_1$-$C_6$ alkyl and phenyl.

26. The method according to claim 25, wherein

Z is N and n is 1.

27. The method according to claim 26, wherein the alkyl amide compound is selected from the group consisting of N,N,N',N'-tetramethylmalonamide, N,N'-dibutyl-N,N'-dimethylmalonamide, N,N,N',N'-tetra(isopropyl)malonamide, N,N,N',N'-tetrahexylmalonamide, 2-methyl-N,N,N',N'-tetrahexylmalonamide, and N,N,N',N'-tetrahexyl-2,2-dimethylmalonamide.

28. The method according to claim 27, wherein the alkyl amide compound is N,N,N',N'-tetramethylmalonamide.

29. The method according to claim 25, wherein

Z is CH, n is 1, and $R_4$ and $R_5$ are H.

30. The method according to claim 29, wherein the alkyl amide compound is N,N-dimethylacetoacetamide.

31. The method according to claim 25, wherein n is 2.

32. The method according to claim 31, wherein the alkyl amide compound is N,N,N',N'-tetramethylsuccinamide.

33. The method according to claim 21, wherein the nanostructured carbon is selected from the group consisting of raw nanostructured carbon soot, purified nanostructured carbon, and mixtures thereof.

34. The method according to claim 21, wherein the nanostructured carbon is selected from the group consisting of carbon nanotubes, nano-onions, nano-horns, and fullerenes.

35. The method according to claim 34, wherein the nanostructured carbon comprises carbon nanotubes selected from the group consisting of single wall carbon nanotubes, double wall carbon nanotubes, and multi-wall carbon nanotubes.

36. The method according to claim 35, wherein the nanostructured carbon comprises single wall carbon nanotubes.

* * * * *